(12) United States Patent
Kim

(10) Patent No.: US 10,438,963 B2
(45) Date of Patent: Oct. 8, 2019

(54) METHOD FOR MANUFACTURING SEMICONDUCTOR DEVICE

(71) Applicant: SK hynix Inc., Gyeonggi-do (KR)

(72) Inventor: Jaeseong Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 8 days.

(21) Appl. No.: 15/620,895

(22) Filed: Jun. 13, 2017

(65) Prior Publication Data
US 2018/0130817 A1 May 10, 2018

(30) Foreign Application Priority Data

Nov. 10, 2016 (KR) .................. 10-2016-0149525

(51) Int. Cl.
*H01L 27/11582* (2017.01)
*H01L 27/11565* (2017.01)

(52) U.S. Cl.
CPC ... *H01L 27/11582* (2013.01); *H01L 27/11565* (2013.01)

(58) Field of Classification Search
CPC .......... H01L 27/11582; H01L 29/1037; H01L 27/11524; H01L 27/11556; H01L 27/11573; H01L 27/1157; H01L 27/11529
See application file for complete search history.

(56) References Cited

U.S. PATENT DOCUMENTS

| | | | |
|---|---|---|---|
| 2013/0234234 A1* | 9/2013 | Yoo | H01L 29/66833 257/324 |
| 2015/0318295 A1* | 11/2015 | Kai | H01L 27/11556 257/319 |
| 2017/0025431 A1* | 1/2017 | Kanakamedala | H01L 27/11578 |

FOREIGN PATENT DOCUMENTS

| | | |
|---|---|---|
| JP | 2014-053585 | 3/2014 |
| KR | 1020120122867 | 11/2012 |
| KR | 1020140028968 | 3/2014 |

* cited by examiner

*Primary Examiner* — Thanh T Nguyen
(74) *Attorney, Agent, or Firm* — IP & T Group LLP

(57) ABSTRACT

Provided herein is a method of manufacturing a semiconductor device. The method for manufacturing the semiconductor device includes: alternately stacked first material layers and second material layers on a lower structure; forming first holes passing through the first material layers and the second material layers, each of the first holes defining a channel region; removing the second material layers through the first holes such that interlayer spaces between the first material layers are formed; and forming, through the first holes, conductive patterns which fill respective interlayer spaces.

20 Claims, 20 Drawing Sheets

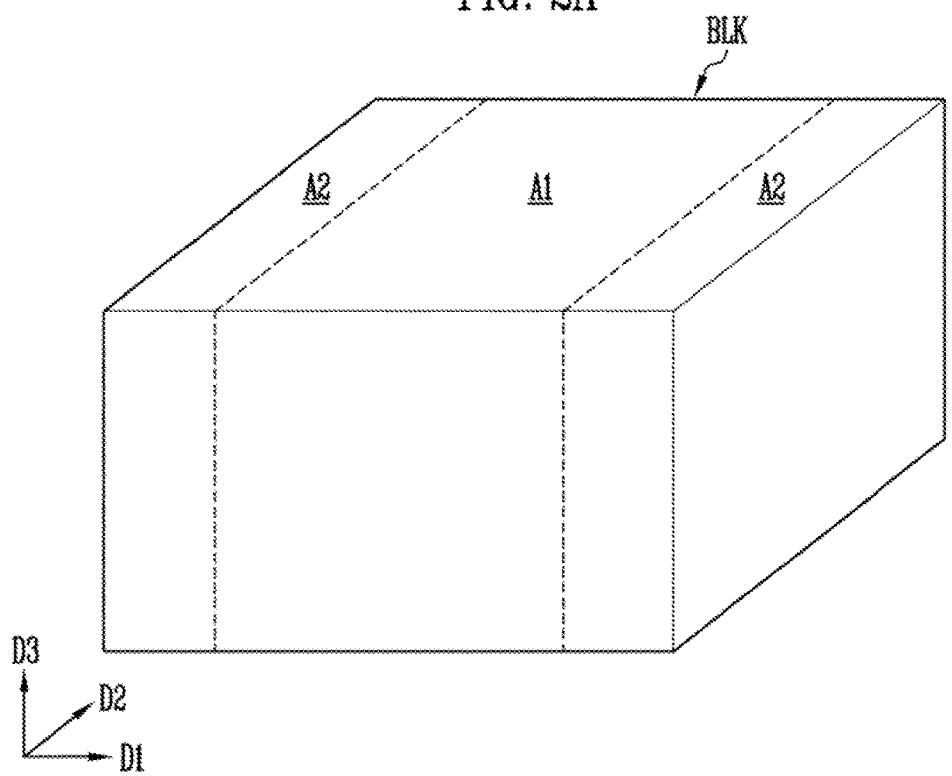
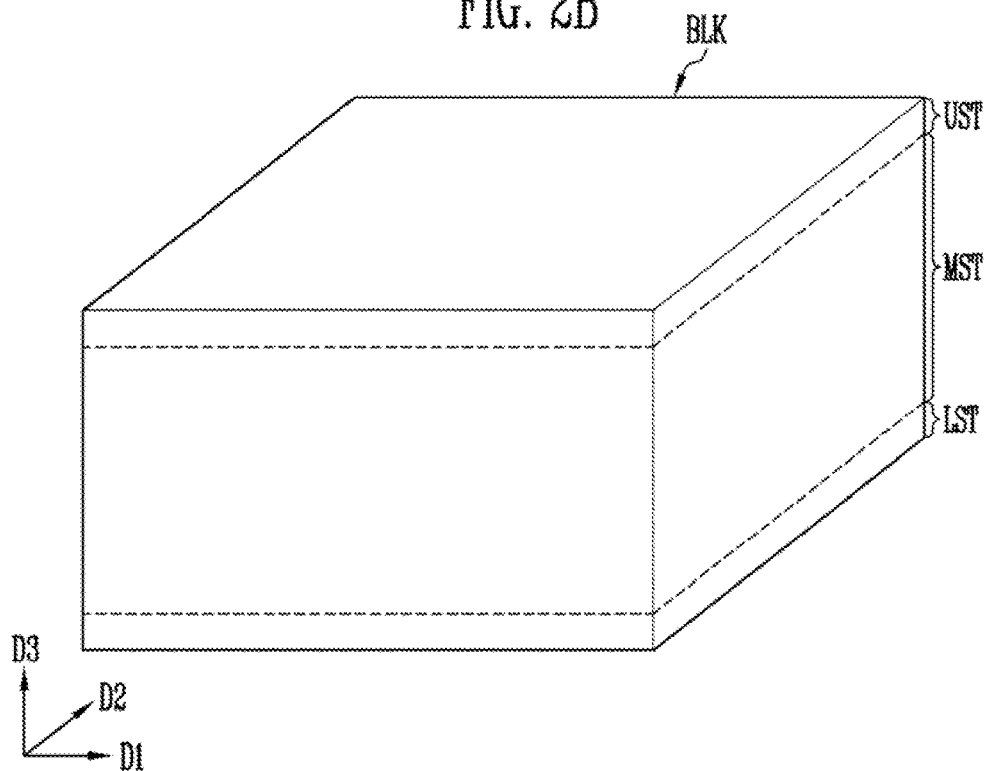

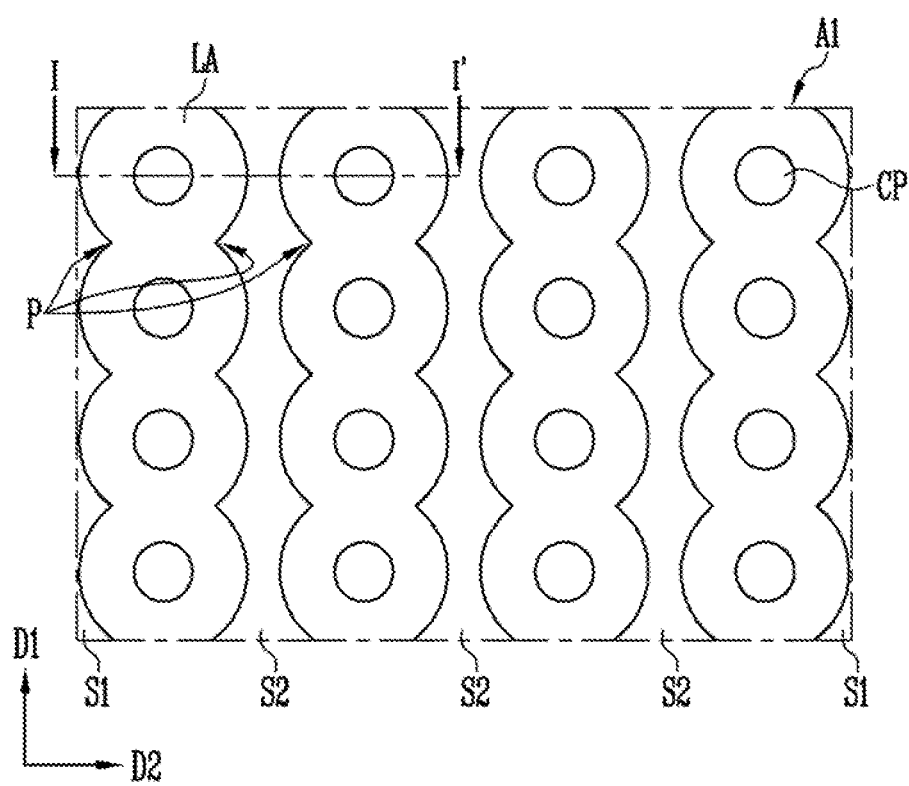

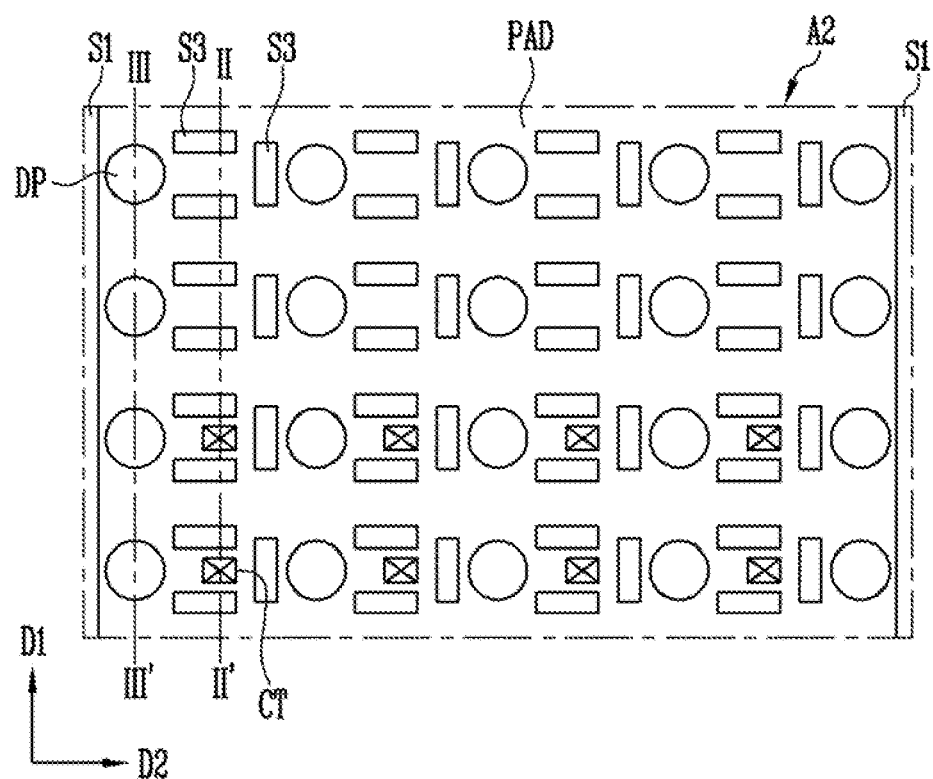

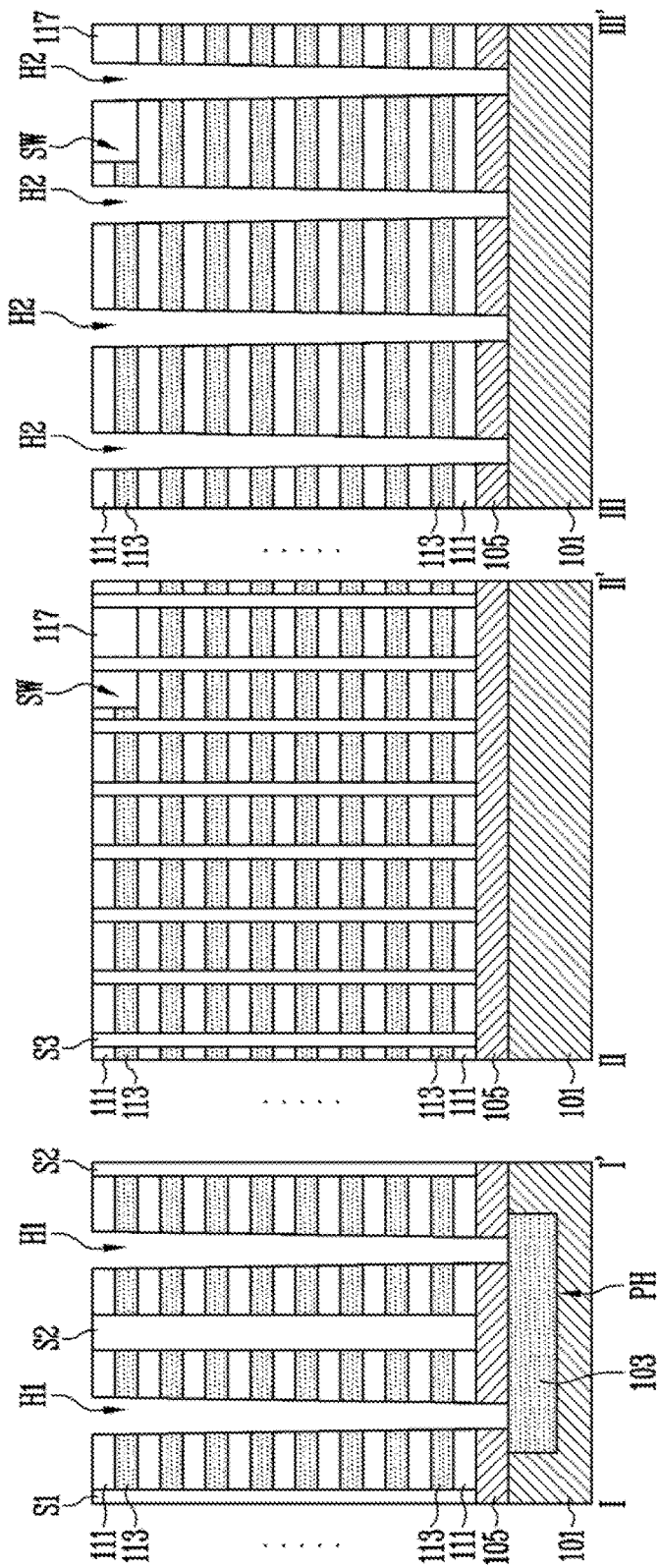

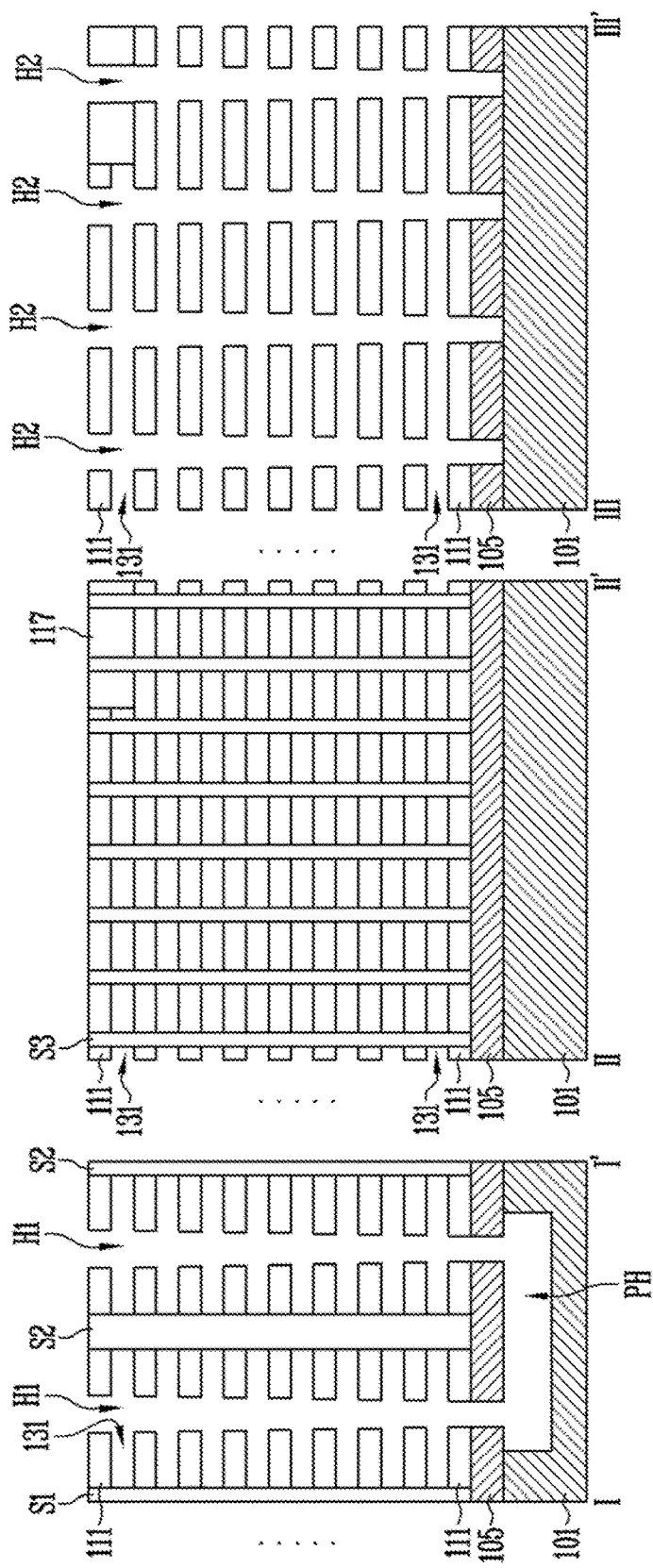

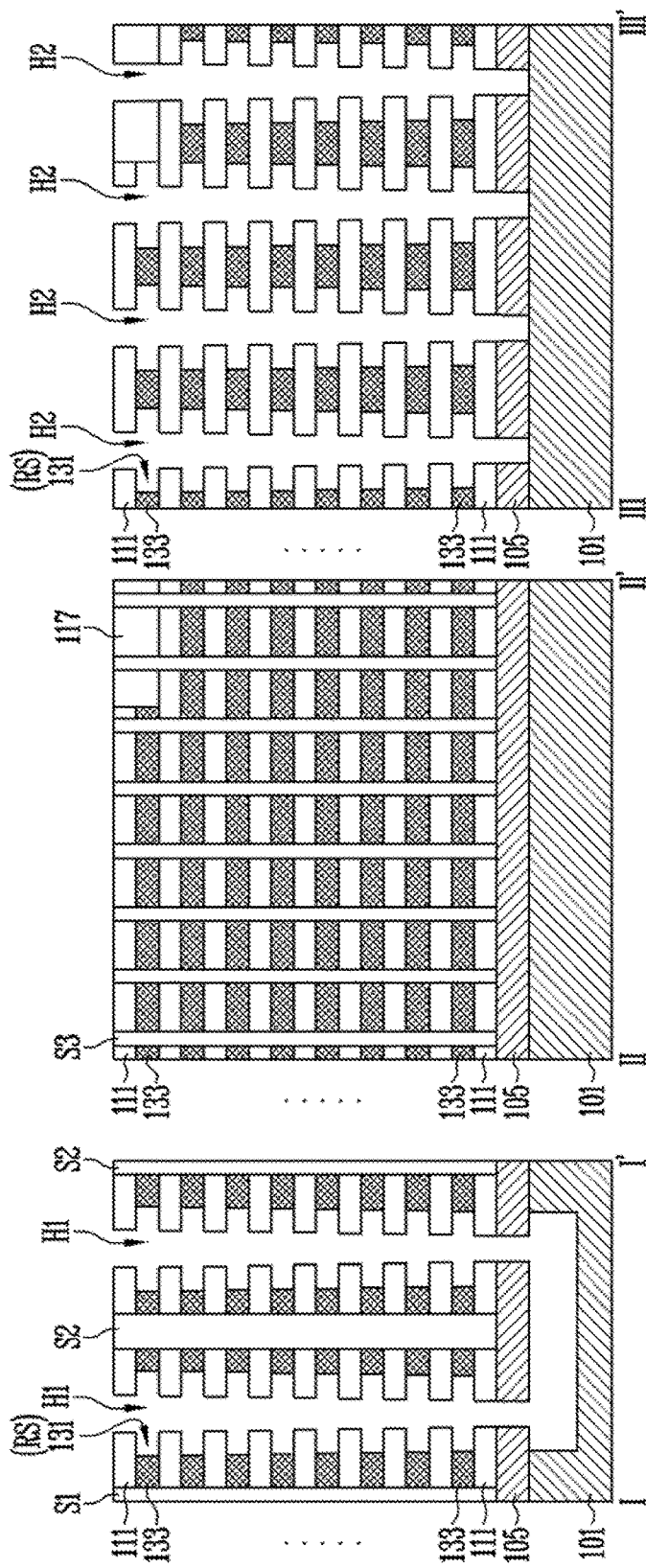

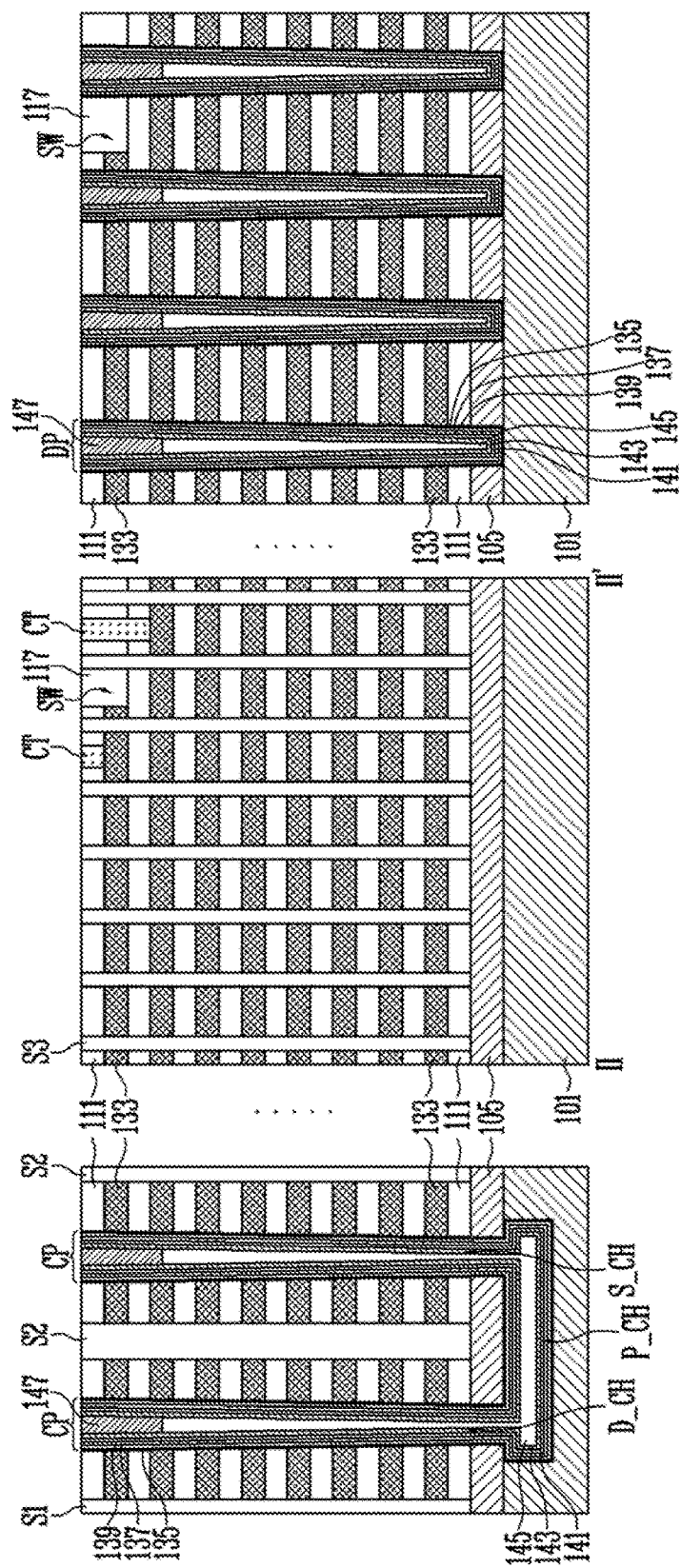

METHOD FOR MANUFACTURING SEMICONDUCTOR DEVICE

CROSS-REFERENCE TO RELATED APPLICATION

The present application claims priority under 35 U.S.C. § 119(a) to Korean patent application number 10-2016-0149525, filed on Nov. 10, 2016, the entire disclosure of which is herein incorporated by reference in its entirety

BACKGROUND

Field of Invention

Various embodiments of the present disclosure relate to a semiconductor device, and more particularly, to a method for manufacturing a semiconductor device including a stack of conductive patterns.

Description of Related Art

A semiconductor device may include a memory array having memory cells capable of storing data. The memory array may be arranged in three dimensions to improve the integration of the semiconductor device. The memory cells arranged in three dimensions may receive gate signals through a stack of conductive patterns. Various techniques have been proposed to simplify a process of manufacturing such a three-dimensional semiconductor device.

SUMMARY

Various embodiments of the present disclosure are directed to a simplified manufacturing method for a semiconductor device.

One embodiment of the present disclosure provides a method for manufacturing the semiconductor device including: alternately stacked first material layers and second material layers on a lower structure; forming first holes passing through the first material layers and the second material layers, each of the first holes defining a channel region; removing the second material layers through the first holes such that interlayer spaces between the first material layers are formed; and forming, through the first holes, conductive patterns which fill respective interlayer spaces.

The method may further include: forming tunnel insulating layers along sidewalls of the first holes; and forming channel layers on the tunnel insulating layers, each of the channel layers being used as the channel region.

Partial regions of the interlayer spaces may be filled with the conductive patterns such that a ring-shaped space is defined in each of the interlayer spaces between the tunnel insulating layers and the conductive patterns.

The method may further include, before the forming of the first holes, simultaneously forming a block separation layer dividing the first material layers and the second material layers into block stacks, and line separation layers dividing each of the block stacks into line stacks.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A and 2B are views illustrating a block stack of the semiconductor device;

FIGS. 3A to 3C are plan views illustrating a first region of the block stack according to an embodiment of the present disclosure;

FIG. 5 is a plan view illustrating a second region of the block stack according to an embodiment of the present disclosure;

FIGS. 8A to 8E are sectional views illustrating a method for manufacturing a semiconductor device according to an embodiment of the present disclosure;

FIGS. 9A and 9B are sectional views illustrating a method for manufacturing a semiconductor device in accordance with an embodiment of the present disclosure;

DETAILED DESCRIPTION

Figure 1:
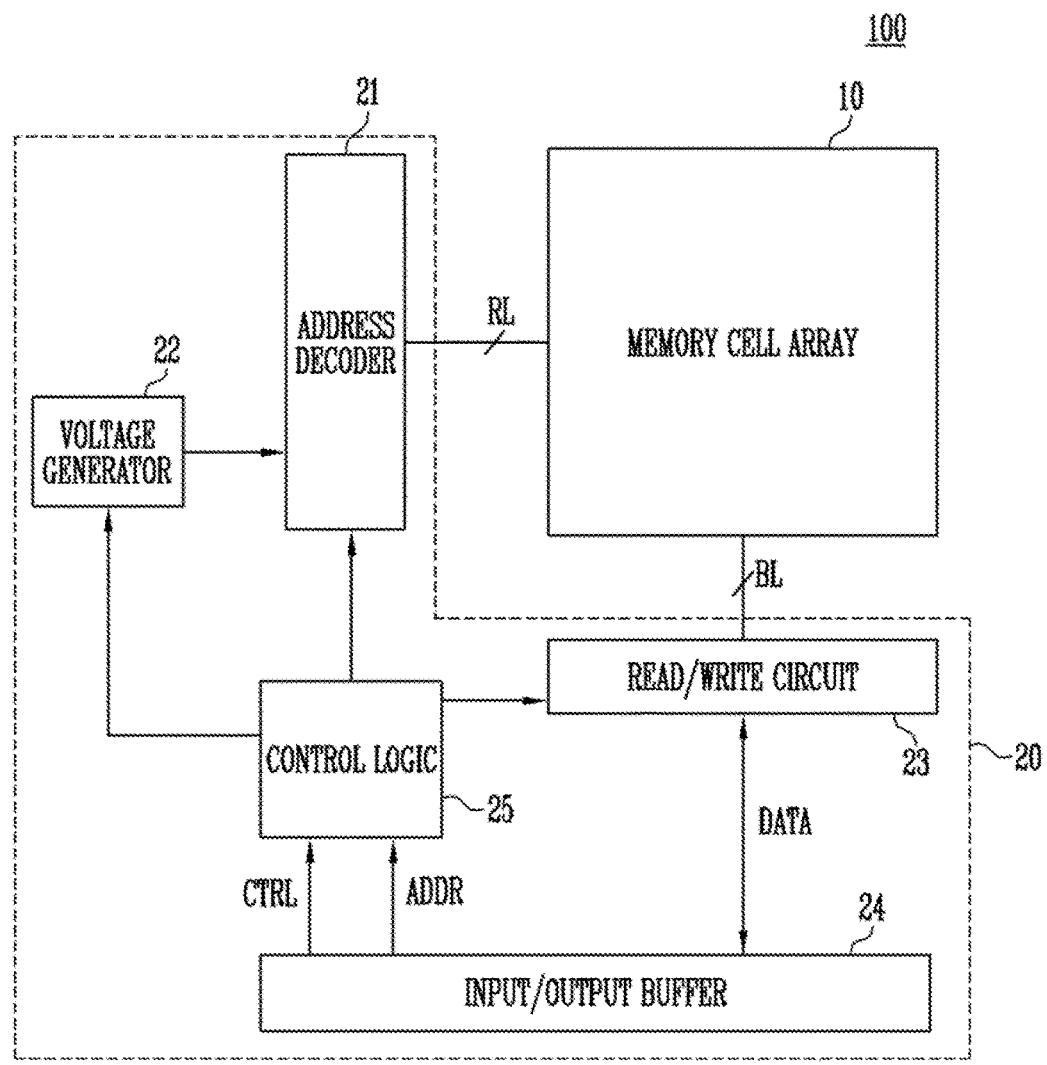
FIG. 1 is a block diagram illustrating a semiconductor device according to an embodiment of the present disclosure.

Hereinafter, embodiments will be described in greater detail with reference to the accompanying drawings. Embodiments are described herein with reference to cross-sectional illustrations that are schematic illustrations of embodiments and intermediate structures. As such, variations from the shapes of the illustrations are to be expected as a result of, for example, manufacturing techniques and/or tolerances. Thus, embodiments should not be construed as limited to the particular shapes of regions illustrated herein but may include deviations in shapes that result from, for example, manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or may be added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor device 100.

Referring to FIG. 1, the semiconductor device 100 includes a memory cell array 10 and a peripheral circuit 20. The semiconductor device 100 may be a nonvolatile memory device. The semiconductor device 100 may be a NAND flash memory device.

The memory cell array 10 is coupled to an address decoder 21 through row lines RL. The memory cell array 10 is coupled to a read/write circuit 23 through bit lines BL.

The memory cell array 10 includes a plurality of memory blocks. Each of the memory blocks includes a plurality of cell strings. Each of cell strings includes a plurality of memory cells which are stacked on a substrate. The memory cells may be nonvolatile memory cells. Memory cells may be coupled in series to each other through a channel layer so as to form a cell string.

The peripheral circuit 20 includes the address decoder 21, a voltage generator 22, the read/write circuit 23, an input/output buffer 24 and a control logic 25.

The address decoder 21 is operated under the control of the control logic 25. The address decoder 21 is coupled to the memory cell array 10 through the row lines RL and is configured to control the row lines RL. The row lines RL are coupled to source select lines, word lines and drain select lines of block stacks that form the memory cell array 10.

The address decoder 21 receives addresses ADDR from the control logic 25.

The addresses ADDR include a block address and a row address. The address decoder 21 is configured to decode the block address among the received addresses ADDR. The address decoder 21 may select a corresponding one of the memory blocks in response to the decoded block address.

The voltage generator 22 is operated under the control of the control logic 25. The voltage generator 22 generates an internal supply voltage using an external supply voltage that is applied to the semiconductor device 100. The internal supply voltage is applied to the address decoder 21, the read/write circuit 23, the input/output buffer 24, and the control logic 25 and is used as an operating voltage of the semiconductor device 100.

The read/write circuit 23 may be coupled to the memory cell array 10 through the bit lines BL. The read/write circuit 23 may be configured to control the bit lines BL in response to the control of the control logic 25.

The control logic 25 is coupled to the address decoder 21, the voltage generator 22, the read/write circuit 23, and the input/output buffer 24. The control logic 25 receives a control signal CTRL and the addresses ADDR from the input/output buffer 24. The control logic 25 is configured to control the overall operation of the semiconductor memory device 100 in response to the control signal CTRL. The control logic 25 transmits the addresses ADDR to the address decoder 21.

The input/output buffer 24 receives the control signal CTRL and the addresses ADDR from the outside, and transmits the received control signal CTRL and addresses ADDR to the control logic 25. In addition, the input/output buffer 24 is configured to transmit data DATA inputted from the outside to the read/write circuit 23, or output data DATA received from the read/write circuit 23 to the outside.

The peripheral circuit 20 may include a plurality of driving transistors and registers to perform the above-described operation. To improve the integration, portions of the peripheral circuit 20 may be disposed to overlap the memory cell array 10, and the memory cell array may include memory cells arranged in three dimensions.

The memory cell array 10 may include block stacks separated from each other by the memory blocks. The block stacks may be controlled by different block select signals. Conductive patterns included in each block stack may be controlled by the same block select signal.

FIGS. 2A and 2B are views illustrating a block stack BLK of a semiconductor device.

Referring to FIG. 2A, the block stack BLk may include a first region A1 and at least one second region A2. The first region A1 is a region in which cell strings are disposed, and the second region A2 is a region in which contact plugs are disposed. The contact plugs come into contact with conductive patterns that transmit gate signals to the cell strings.

The second region A2 is disposed adjacent to the first region A1 in a first direction D1. The cell strings may be arranged in a matrix shape in the first direction D1 and a second direction D2 intersecting the first direction D1. The conductive patterns that transmit gate signals to the cell strings may be stacked in a third direction D3. The third direction D3 perpendicularly intersects a horizontal surface that extends in the first direction D1 and the second direction D2.

Referring to FIG. 2B, a block stack BLk may include a lower structure LST, a middle structure MST and an upper structure UST that are stacked in the third direction D3.

For example, the lower structure LST may include a pipe gate that transmits a gate signal to a pipe transistor. The middle structure MST may include word lines that transmit gate signals to memory cells. The upper structure UST may include drain select lines that transmit gate signals to drain select transistors, and source select lines that transmit gate signals to source select transistors.

For another example, the lower structure LST may include source select lines and a source region. The source select lines transmit gate signals to source select transistors. The middle structure MST may include word lines that transmit gate signals to memory cells. The upper structure UST may include drain select lines that transmit gate signals to drain select transistors.

Figure 3A:
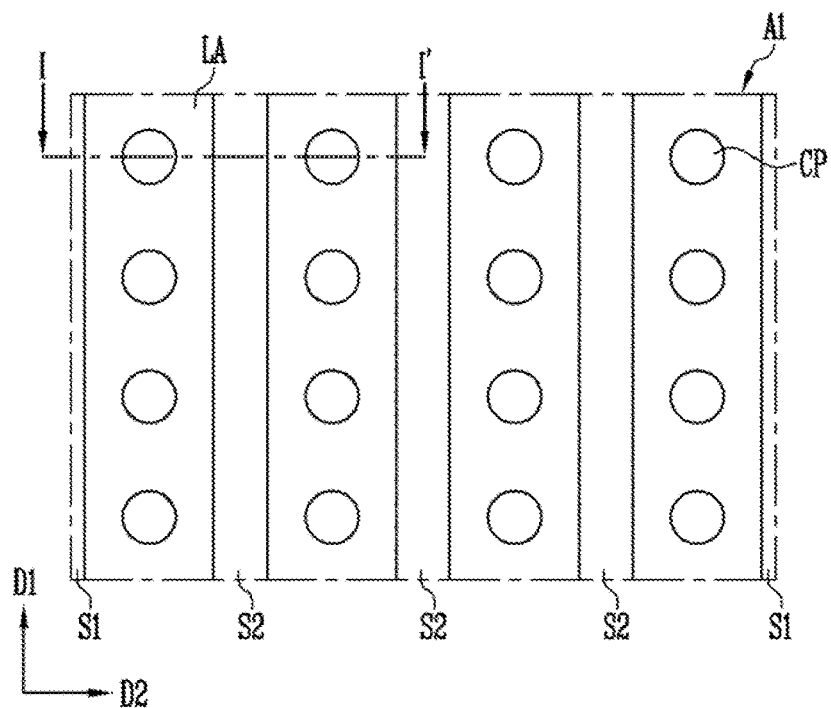
Figure 3B:
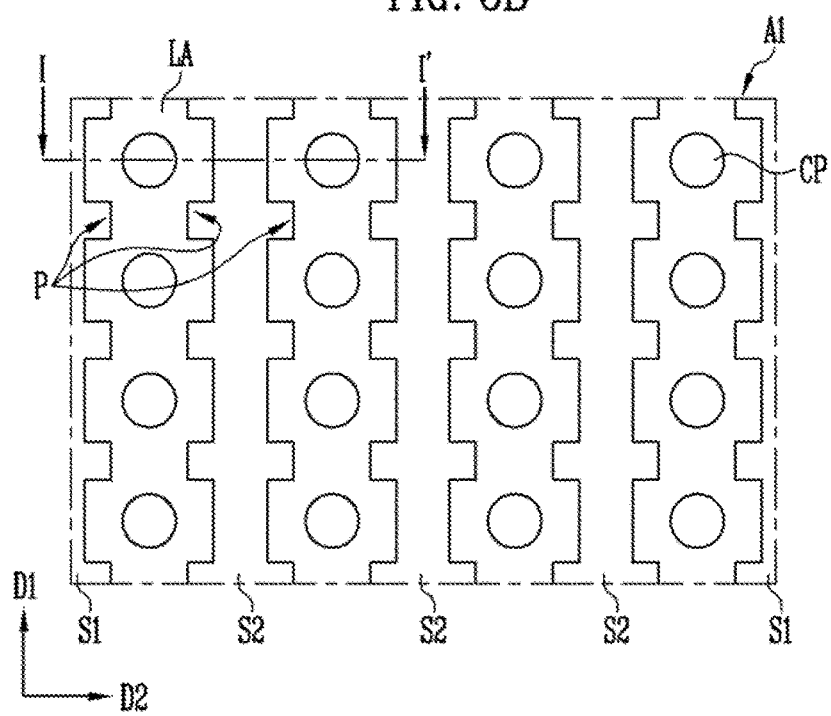

FIGS. 3A to 3C are plan views illustrating various embodiments of the first region of the block stack according to the present disclosure.

Referring to FIGS. 3A to 3C, block separation layers S1 that separate block stacks from each other may be disposed in the first region A1. Each of the block stacks may be separated into a plurality of line stacks LA by line separation layers S2 in the first region A1. The line separation layers S2 are disposed in the first region A1 and arranged between adjacent block separation layers S1 in the second direction D2.

The block separation layers S1, the line separation layers S2 and the line stacks LA may extend in the first direction D1.

Each of the line stacks LA is penetrated by cell pillars CP. The cell pillars CP may be disposed on a straight line along the first direction D1, or disposed in a zigzag manner. Each of the line stacks LA may be penetrated by a row of cell pillars CP, as shown in the drawings, or by two or more rows of cell pillars CP although not shown.

Each of the block separation layers S1 and the line separation layers S2 may have a linear shape, as shown in the FIG. 3A. The block separation layers S1 and the line separation layers S2 may include protrusions P protruding between cell pillars CP that are adjacent to each other with respect to the first direction D1, as shown in FIGS. 3B and 3C. Consequently, a sidewall of each of the block separation layers S1 and line separation layers S2 has a protrusion-depression structure.

Referring to FIG. 3B, each of the protrusions P of the block separation layers S1 and line separation layers S2 may be formed in the form of a bar extending in the second direction D2.

Referring to FIG. 3C, a sidewall of each of the block separation layers S1 and line separation layers S2 has a protrusion-depression structure corresponding to the outer shapes of the cell pillars CP. For example, when each cell pillar CP has a circular cross-section, the sidewall of each of the block separation layers S1 and line separation layers S2 may have a waved shape corresponding to the outer shapes of the cell pillars CP.

Figure 4A:
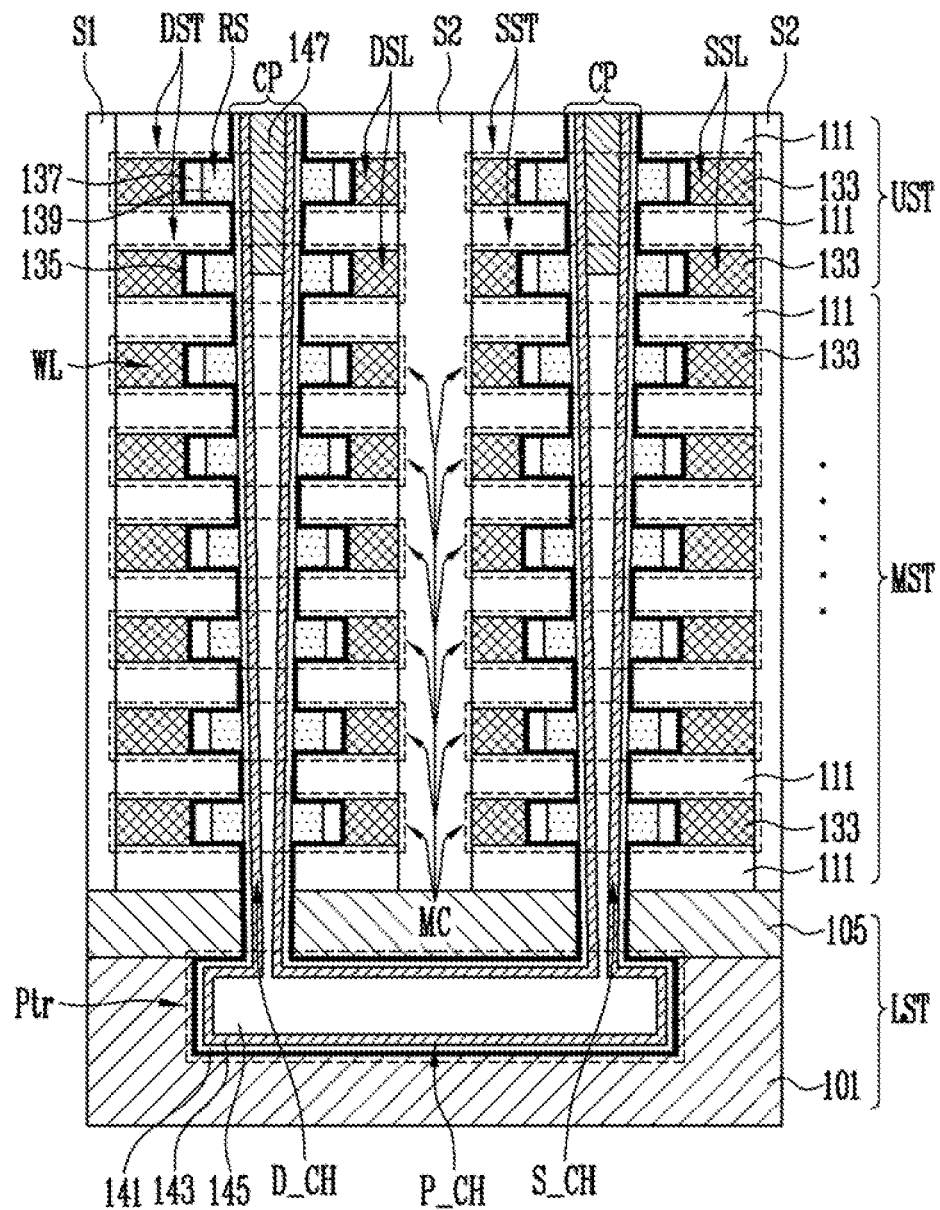
FIGS. 4A and 4B are sectional views illustrating embodiments of a cell string according to the present disclosure.
Figure 4B:
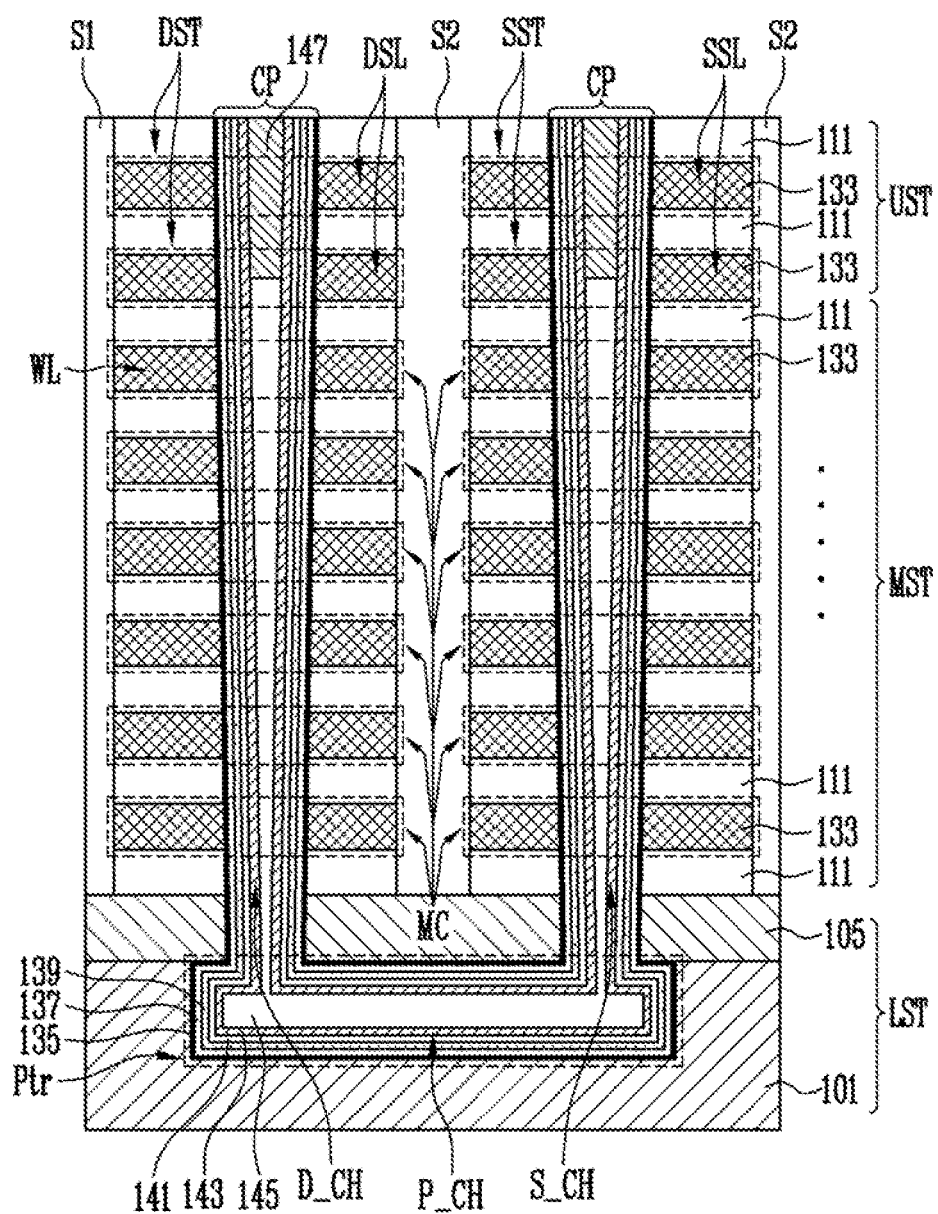

FIGS. 4A and 4B are sectional views illustrating various embodiments of a cell string according to the present disclosure. In detail, referring to FIGS. 4A and 4B, there is illustrated the case in which the lower structure includes a pipe transistor. Furthermore, FIGS. 4A and 4B are sectional views of the first region taken along line I-I' of FIGS. 3A to 3C.

Referring to FIGS. 4A and 4B, the cell string may include at least one drain select transistor DST, memory cells MC, a pipe transistor Ptr and at least one source select transistor SST that are coupled in series by a channel layer 143. The memory cells MC may be arranged in at least two rows on the pipe transistor Ptr. The drain select transistor DST may be disposed to have a single layered or a two or more layered structure over the memory cells MC. The source select transistor SST may be disposed to have a single layered or a two or more layered structure over the memory cells MC.

A gate of the pipe transistor Ptr is portion of a pipe gate. The pipe gate may include a first pipe gate 101 and a second pipe gate 105 that are formed of conductive materials. The second pipe gate 105 may be disposed on the first pipe gate 101. A channel region P_CH of the pipe transistor Ptr is portion of the channel layer 143 that is enclosed by the first and second pipe gates 101 and 105. The first and second pipe gates 101 and 105 correspond to the lower structure LST described with reference to FIG. 2B. The lower structure LST may extend from the first region A1 to the second region A2 shown in FIG. 2A.

Interlayer insulating layers 111 and conductive patterns 133 are alternately stacked on the lower structure LST. The interlayer insulating layers 111 and conductive patterns 133 that are alternately stacked may be divided into the middle structure MST and the upper structure UST disposed on the middle structure MST. The interlayer insulating layers 111 and conductive patterns 133 that are alternately stacked may be penetrated by the block separation layer S1 and the line separation layers S2.

The conductive patterns 133 of the middle structure MST are word lines WL that are used as gates of the memory cells MC. The conductive patterns 133 of the upper structure UST are a drain select line DSL that is used as a gate of the drain select transistor DST and a source select line SSL that is used as a gate of the source select transistor SST. Each of the drain select line DSL and the source select line SSL may be disposed to have a single layered or a two or more layered structure over the word lines WL.

At least some of the line separation layers S2 are disposed between the drain select line DSL and the source select line SSL. The word lines WL may be divided into drain side word lines and source side word lines by the line separation layers S2. The drain side word lines are word lines WL that are disposed below the drain select line DSL, and the source side word lines are word lines WL that are disposed below the source select line SSL.

The interlayer insulating layers 111 and the conductive patterns 133 may be penetrated by the cell pillars CP in the first region. Each of the cell pillars CP may include a first multilayer layer.

Referring to FIG. 4A, the first multilayer layer may include a tunnel insulating layer 141 and the channel layer 143 that are formed along a sidewall of each of first holes passing through the interlayer insulating layers 111 and the conductive patterns 133 in the first region. The channel layer 143 may extend into the first pipe gate 101 and the second pipe gate 105 such that portion of the channel layer 143 is used as the pipe channel region P_CH. The channel layer 143 may include a drain side channel region D_CH that extends from a first end of the pipe channel region P_CH and passes through the drain select line DSL and the drain side word lines disposed below the drain select line DSL, and a source side channel region S_CH that extends from a second end of the pipe channel region P_CH and passes through the source select line SSL and the source side word lines disposed below the source select line SSL.

The tunnel insulating layer 141 extends and encloses the pipe channel region P_CH such that a portion of the tunnel insulating layer 141 is used as a gate insulating layer of the pipe transistor Ptr.

The horizontal distances from the cell pillars CP to the conductive patterns 133 may be greater than the horizontal distances from the cell pillars CP to the interlayer insulating layers 111. Consequently, ring-shaped spaces RS may be defined between the interlayer insulating layers 111. Each of the ring-shaped spaces RS may be filled with a first blocking insulating layer 137 and a data storage layer 139.

Each first blocking insulating layer 137 is formed on the sidewall of the corresponding conductive pattern 133 in the associated ring-shaped space RS. Each data storage layer 139 is sealed in the corresponding ring-shaped space RS. When the data storage layers 139 are separated from each other by the interlayer insulating layers 111 rather than being coupled to each other, the data retaining characteristics of the memory cells MC may be enhanced. In addition, an interference phenomenon between the memory cells MC disposed at different layers may be mitigated.

The interlayer insulating layers 111 may make direct contact with the cell pillars CP. Alternatively, a second blocking insulating layer 135 may be disposed between the interlayer insulating layers 111 and the cell pillars CP. The second blocking insulating layer 135 may extend along interfaces between the interlayer insulating layers 111 and the cell pillars CP, surfaces of the ring-shaped spaces RS, and an outer surface of the pipe channel region P_CH.

Referring to FIG. 4B, the first multilayer layer may include a first blocking insulating layer 137, a data storage layer 139, a tunnel insulating layer 141 and a channel layer 143 that are formed along a sidewall of each of first holes passing through the interlayer insulating layers 111 and the conductive patterns 133, in the first region. The channel layer 143 and the tunnel insulating layer 141 may have the same structure as those described with reference to FIG. 4A.

The first blocking insulating layer 137 encloses an outer surface of the tunnel insulating layer 141, and the data storage layer 139 is disposed between the tunnel insulating layer 141 and the first blocking insulating layer 137. The first blocking insulating layer 137 and the data storage layer 139 extend to enclose the pipe channel region P_CH and thus can be used as a gate insulating layer of the pipe transistor Ptr.

The cell pillars CP and the pipe channel region P_CH may be enclosed by a second blocking insulating layer 135.

Referring to FIGS. 4A and 4B, the channel layer 143 may be made of semiconductor material. The channel layer 143 may have the form of a liner enclosing a core insulating layer 145. In this case, ends of the core insulating layer 145 may be formed lower than ends of the channel layer 143. The ends of the channel layer 143 may be formed to enclose capping layers 147 disposed on the respective ends of the core insulating layer 145. Each capping layer 147 may be formed of a doped silicon layer and used as a junction.

Each conductive pattern 133 may include at least one among a doped silicon layer, a silicide layer and a metal layer. The metal layer may be made of metal having resistance lower than that of the silicon layer and, for example, may include tungsten.

The first blocking insulating layer 137 may be formed of a silicon oxide layer. The data storage layer 139 may be formed of a silicon nitride layer capable of trapping charges. The tunnel insulating layer 141 may be formed of a silicon oxide layer making charge tunneling possible. The second blocking insulating layer 135 may be formed of an insulating layer capable of preventing a back tunneling phenomenon. For example, the second blocking insulating layer 135 may be formed of an aluminum oxide layer $Al_2O_3$.

The first blocking insulating layer 137 and the data storage layer 139 disposed between the drain select line DSL and the channel layer 143 may be used as a gate insulating layer of the drain select transistor DST. The first blocking insulating layer 137 and the data storage layer 139 disposed between the source select line SSL and the channel layer 143 may be used as a gate insulating layer of the source select transistor SST.

FIG. 5 is a plan view illustrating a second region of a block stack according to an embodiment of the present disclosure.

Referring to FIG. 5, the block separation layers S1 that separate block stacks from each other extend from the first region A1 to the second region A2. Although each of the block separation layers S1 shown in FIG. 5 has a linear shape, the shape of the block separation layer S1 is not limited to a linear shape. For example, each block separation layer S1 of the second region A2 may include protrusions and include sidewalls each having a protrusion-depression structure, as described above with reference to FIGS. 3B and 3C.

An end of each of the line stacks LA described with reference to FIGS. 3A to 3C extends to the second region A2. Hereinafter, the end of each line stack LA is defined as a pad PAD. The pad PAD may be patterned in a stepwise shape in the second region A2. The pad PAD may be penetrated by insulating pillars S3.

The pad PAD may be penetrated by dummy pillars DP. Ends of conductive patterns that constitute the pad PAD come into contact with contact plugs CT. The contact plugs CT may be disposed between the dummy pillars DP in the second region A2.

Figure 6:
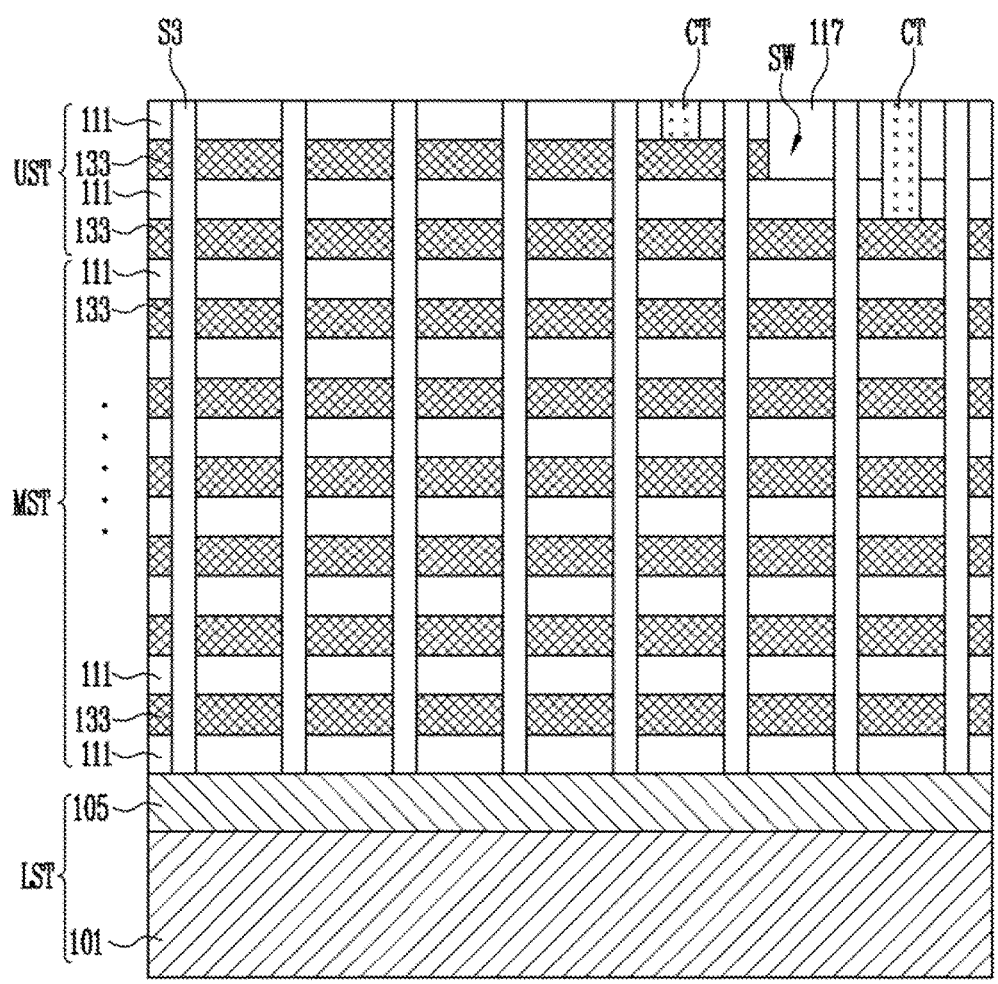
FIG. 6 is a sectional view illustrating the coupling relationship between the block stack and contact plugs according to an embodiment of the present disclosure.
Figure 7A:
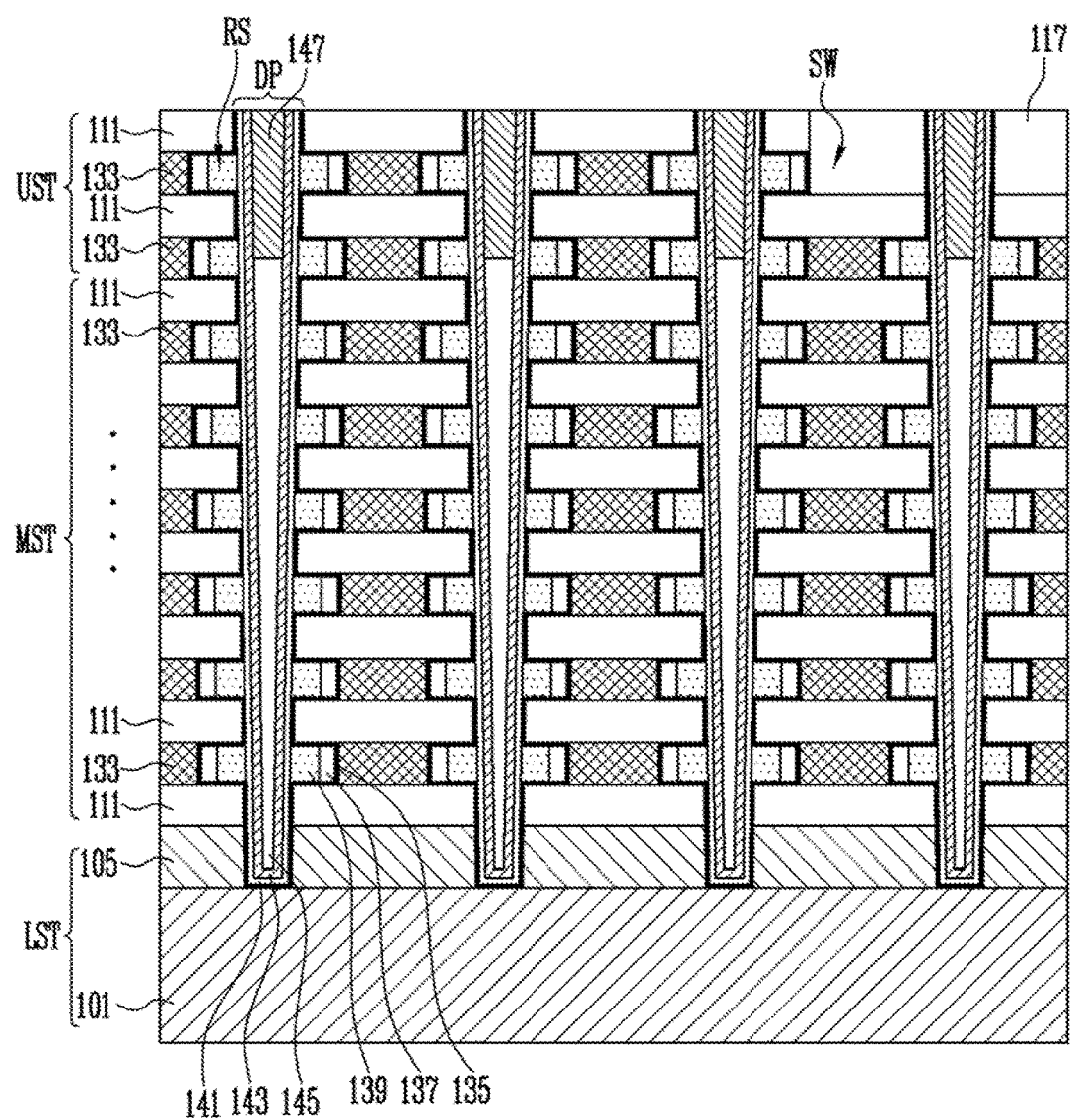
FIGS. 7A and 7B are sectional views illustrating a dummy structure according to an embodiment of the present disclosure.
Figure 7B:
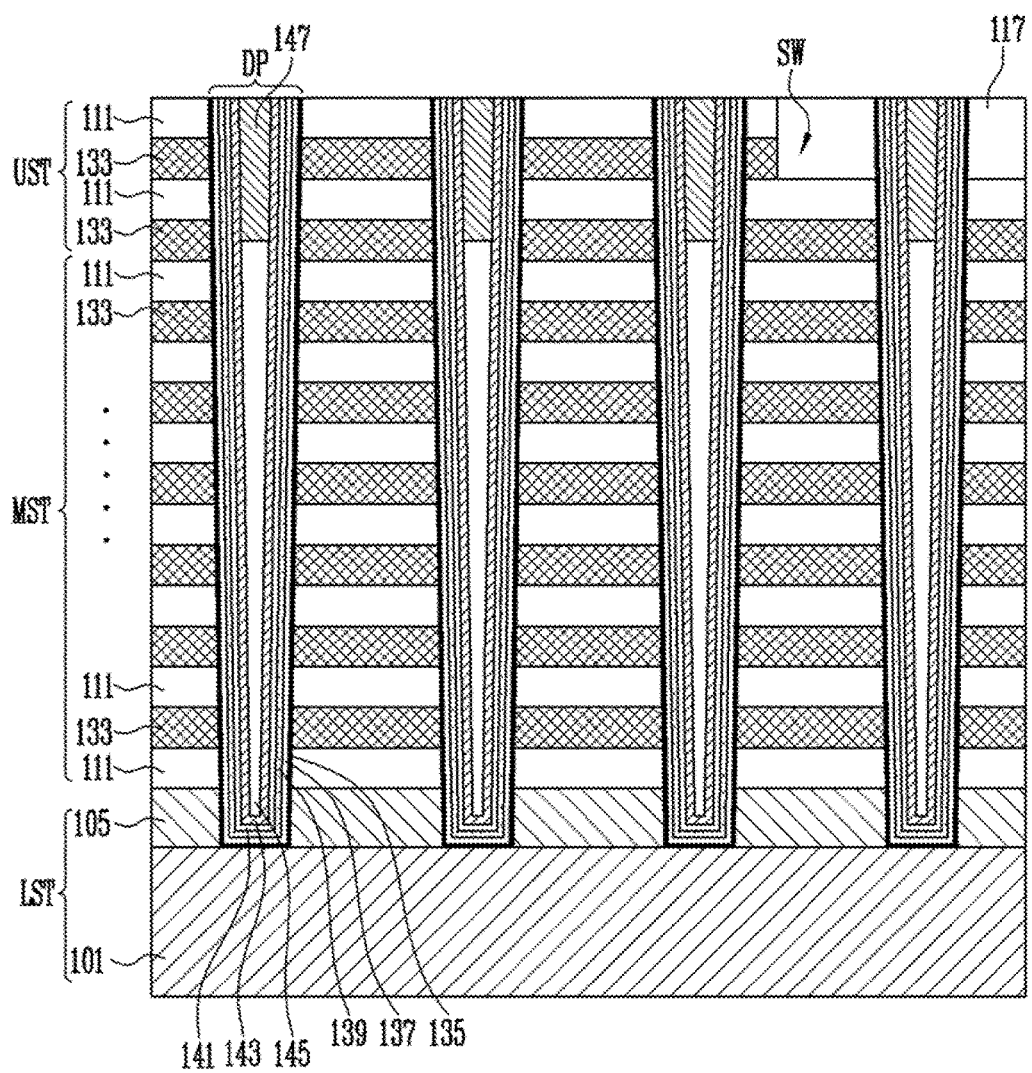

FIG. 6 is a sectional view illustrating the coupling relationship between a block stack and contact plugs. FIGS. 7A and 7B are sectional views illustrating a dummy structure. In detail, FIGS. 6, 7A and 7B illustrate the case in which the lower structure includes a pipe transistor. Furthermore, FIG. 6 is a sectional view taken along line II-II' of FIG. 5, and FIGS. 7A and 7B are sectional view taken along line III-III' of FIG. 5.

Referring to FIGS. 6, 7A and 7B, ends of the lower structure LST, the middle structure MST and the upper structure UST are disposed in the second region.

The lower structure LST in the second region includes the first pipe gate 101 and the second pipe gate 105 that extend from the first region.

The middle structure MST and the upper structure UST in the second region include the interlayer insulating layers 111 and the conductive patterns 133 that extend from the first region. The interlayer insulating layers 111 and the conductive patterns 133 may be patterned to have a stepwise structure SW in the second region. The stepwise structure SW may be covered with a planarization insulating layer 117.

Referring to FIG. 6, the interlayer insulating layers 111 and the conductive patterns 133 may be penetrated by the insulating pillars S3 in the second region. The insulating pillars S3 are disposed at positions spaced apart from each other such that the pad PAD of FIG. 5 is not separated into a plurality of patterns by the insulating pillars S3.

The contact plugs CT may extend to contact the conductive patterns 133 corresponding thereto.

Referring to FIGS. 7A and 7B, a dummy structure is formed in the second region. The dummy structure may include dummy pillars DP passing through the interlayer insulating layers 111 and the conductive patterns 133 in the second region. Each of the dummy pillars DP may include a second multilayer layer made of the same material as that of the first multilayer layer described with reference to FIG. 4A or 4B.

Referring to FIG. 7A, the second multilayer layer may be made of the same material as that of the first multilayer layer described with reference to FIG. 4A. In detail, the second multilayer layer may include a tunnel insulating layer 141 and a channel layer 143 that are formed along a sidewall of each of second holes passing through the interlayer insulating layers 111 and the conductive patterns 133 in the second region. The second holes may extend into the second pipe gate 105. The tunnel insulating layer 141 and the channel layer 143 may extend onto the bottom of each of the second holes.

The ring-shaped spaces RS described with reference to FIG. 4A may extend between the interlayer insulating layers 111 disposed in the second region. In this case, the horizontal distances from the dummy pillars DP to the conductive patterns 133 may be greater than the horizontal distances from the dummy pillars DP to the interlayer insulating layers 111. The dummy structure may further include first blocking insulating layers 137 and data storage layers 139 with which the ring-shaped spaces RS of the second region are filled.

Each first blocking insulating layer 137 is formed on the sidewall of the corresponding conductive pattern 133 in the associated ring-shaped space RS. Each data storage layer 139 may be sealed in the corresponding ring-shaped space RS by the associated tunnel insulating layers 141.

The second blocking insulating layers 135 described with reference to FIG. 4A may extend on surfaces of the second holes and interlayer spaces in the second region.

Referring to FIG. 7B, the second multilayer layer may include a first blocking insulating layer 137, a data storage layer 139, a tunnel insulating layer 141 and a channel layer 143 that are formed along a sidewall of each of second holes passing through the interlayer insulating layers 111 and the conductive patterns 133 in the second region. The second holes, the channel layer 143 and the tunnel insulating layer 141 may have the same structure as that described above with reference to FIG. 7A.

The first blocking insulating layer 137 encloses an outer surface of the tunnel insulating layer 141, and the data storage layer 139 is disposed between the tunnel insulating layer 141 and the first blocking insulating layer 137.

The second blocking insulating layers 135 described with reference to FIG. 4B may be disposed on surfaces of the second holes in the second region.

Referring to FIGS. 7A and 7B, the channel layer 143 in the second region may be formed of semiconductor material. The channel layer 143 may have the form of a liner enclosing a core insulating layer 145. In this case, the core insulating layer 145 may be formed lower than the channel layer 143, and the channel layer 143 may be formed to enclose a capping layer 147 disposed on the core insulating layer 145. The capping layer 147 disposed in the second region may be formed of a doped silicon layer, and may be included in the dummy structure.

FIGS. 8A to 8E are sectional views illustrating a method for manufacturing a semiconductor device according to an embodiment of the present disclosure. In particular, FIGS. 8A to 8E show, by steps of a process, a sectional view of the first region taken along line I-I' of FIGS. 3A to 3C and sectional views of the second region taken along line II-II' and line III-III' of FIG. 5. In addition, FIGS. 8A to 8E are sectional views illustrating the method for manufacturing a semiconductor device including a pipe transistor.

Referring to FIG. 8A, a lower structure is formed including a pipe gate in which a sacrificial layer 103 is embedded. An example of the process of forming the lower structure will be described in detail below.

First, a conductive layer is deposited to form a first pipe gate 101. Thereafter, a first pipe hole PH is formed in the first region by etching the first pipe gate 101. Subsequently, the first pipe hole PH is filled with the sacrificial layer 103. The sacrificial layer 103 may be formed of the same material as that of second material layers 113 to be formed through a following process.

Subsequently, a conductive layer is deposited to form a second pipe gate 105 on the first pipe gate 101 in such a way that the sacrificial layer 103 is covered with the conductive layer.

After the lower structure has been formed as described above, first material layers that are used as interlayer insulating layers 111 and the second material layers 113 having an etch selectivity relative to the first material layers are alternately stacked on the lower structure. The second material layers 113 may be made of insulating material having an etch selectivity relative to the interlayer insulating layers 111. For example, the interlayer insulating layers 111 may be formed of oxide layers, and the second material layers 113 may be formed of non-metal nitride layers.

Subsequently, the interlayer insulating layers 111 and the second material layers 113 are etched to form a stepwise structure SW in the second region. The stepwise structure SW is formed in the first direction D1 and the second direction D2 shown in FIG. 5. Due to the stepwise structure SW, material layers disposed on different layers are exposed in the first direction D1 and the second direction D2.

Thereafter, a planarization insulating layer 117 may be formed to cover the stepwise structure SW.

Subsequently, the block separation layer S1, the line separation layers S2 and the insulating pillars S3 may be simultaneously formed to pass through the interlayer insulating layers 111 and the second material layers 113. An example of the process of forming the block separation layer S1, the line separation layers S2, and the insulating pillars S3 will be described in detail below.

First, slits and holes are formed by etching the interlayer insulating layers 111 and the second material layers 113. The slits may include a first slit defining a region in which the block separation layer S1 is formed, and second slits defining respective regions in which the line separation layers S2 are formed. The holes may be spaced apart from the first slit and the second slits, and may be disposed at positions spaced apart from each other in the second region.

Subsequently, an insulating layer is formed such that the first slit, the second slits and the holes are filled therewith. Thereafter, the surface of the insulating layer may be flattened. In this way, the block separation layer S1 with which the first slit is filled, the line separation layers S2 with which the second slits are filled, and the insulating pillars S3 with which the holes are filled are formed.

The block separation layer S1 separates the interlayer insulating layers 111 and the second material layers 113 into block stacks, and the line separation layers S2 separate the respective block stacks into line stacks. An end of each of the line stacks has the stepwise structure SW. The insulating pillars S3 are disposed to pass through the ends of the respective line stacks.

In an embodiment of the present disclosure, the block separation layer S1, the line separation layers S2, and the insulating pillars S3 are simultaneously formed. Therefore, according to the embodiment of the present disclosure, the process of manufacturing the semiconductor device may be simplified.

After the block separation layer S1, the line separation layers S2 and the insulating pillars S3 have been formed, first holes H1 and second holes H2 are simultaneously formed by etching the interlayer insulating layers 111 and the second material layers 113. The first holes H1 pass through the interlayer insulating layers 111 and the second material layers 113. The first holes H1 are disposed between the block separation layer S1 and the line separation S2 that are adjacent to each other in the first region, and between adjacent line separation layers S2 in the first region. The second holes H2 pass through the interlayer insulating layers 111 and the second material layers 113 in the second region.

The first holes H1 and the second holes H2 may further pass through the second pipe gate 105. Consequently, the sacrificial layer 103 may be exposed through the first holes H1.

The planarization insulating layer 117 may be etched during the process of forming the first holes H1 and the second holes H2.

Referring to FIG. 8B, the second material layers are removed through the first holes H1 and the second holes H2 such that interlayer spaces 131 are formed between the interlayer insulating layers 111. Each of the interlayer spaces 131 extends from the first region to the second region. The first holes H1 may be used as an inlet for etching material to be used to remove the second material layers of the first region, and the second holes H2 may be used as an inlet for etching material to be used to remove the second material layers that constitute the ends of the respective line stacks.

When the sacrificial layer described with reference to FIG. 8A is formed of the same non-metal nitride layer as that of the second material layers, the sacrificial layer may be removed while the second material layers are removed. Consequently, a pipe hole PH disposed in the first pipe gate 101 may be open. According to an embodiment of the present disclosure, the second material layers and the sacrificial layer may be removed in the same etching step, whereby the interlayer spaces 131 and the pipe hole PH may be open in the same etching step. Therefore, the process of manufacturing the semiconductor device may be simplified. In addition, compared to a metal material layer, the non-metal nitride layer may be easily removed at low cost for a short time without remnants. Therefore, the process of etching the second material layers and the sacrificial layers may be facilitated.

According to an embodiment of the present disclosure, the shape of the interlayer spaces 131 and the shape in which the interlayer insulating layers 111 are stacked may be supported and maintained by the block separation layer S1, the line separation layers S2 and the insulating pillars S3.

Referring to FIG. 8C, conductive patterns 133 with which the interlayer spaces 131 are respectively filled are formed through the first holes H1 and the second holes H2. The following processes may be performed to form the conductive patterns 133.

First, a conductive layer may be formed such that at least portion of each of the interlayer spaces 131 is filled therewith. Thereafter, an etching process and a cleaning process may be performed to remove the conductive layer from the first holes H1, the second holes H2 and the pipe hole PH. The conductive layer for the conductive patterns 133 is drawn through the first holes H1 toward the open interlayer spaces in the first region, and is drawn through the second holes H2 from the ends of the respective line stacks toward the open interlayer spaces in the second region.

According to an embodiment of the present disclosure, since the conductive patterns 133 are formed before cell pillars are formed, a problem in which the cell pillars impede formation of the conductive patterns 133 may be fundamentally prevented. Therefore, according to an embodiment of the present disclosure, the conductive patterns 133 may be easily drawn to sidewalls of the interlayer spaces 131 that are relatively distant from the first holes H1 and second holes H2 that are inlets of the conductive patterns 133. Consequently, a sufficient volume of each conductive pattern 133 may be ensured, whereby the resistance of the conductive pattern 133 may be mitigated. Therefore, a word line loading problem may be reduced. Furthermore, although the diameter of each cell pillar is comparatively large, a problem in which the formation of the conductive layer is impeded by the cell pillars is prevented. Therefore, according to an embodiment of the present disclosure, factors limiting the diameter of each cell pillar are reduced.

A portion of each of the conductive patterns 133 with which the respective interlayer spaces 131 are filled, is recessed. Consequently, each conductive pattern 133 remains in only a portion of the corresponding interlayer space 131 so that the ring-shaped space RS is formed in the interlayer space 131.

Figure 8D:
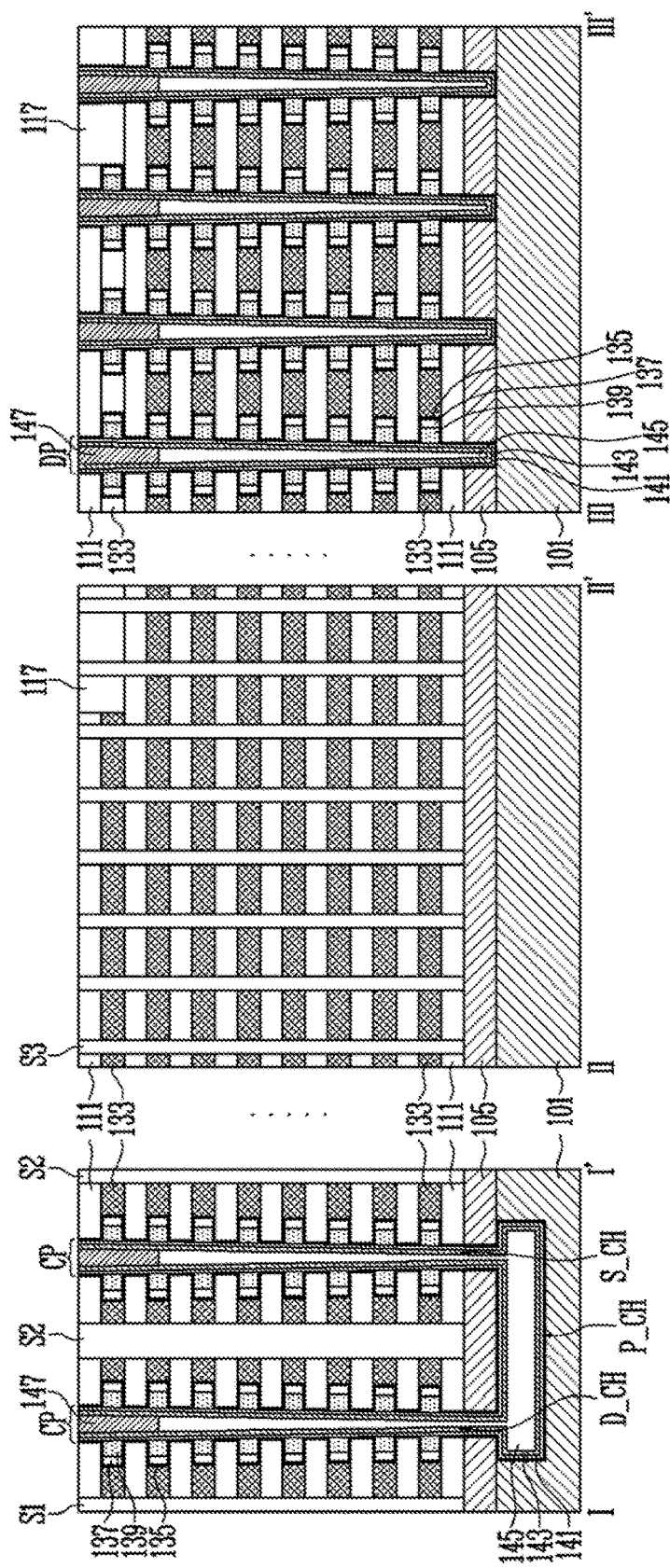

Referring to FIG. 8D, the first blocking insulating layers 137 are formed to cover the sidewalls of the respective conductive patterns 133 formed in the ring-shaped spaces. Thereafter, data storage layers 139 with which the respective ring-shaped spaces are filled are formed on the respective first blocking insulating layers 137.

The first blocking insulating layers 137 may be formed by depositing an insulating layer capable of blocking charges and then removing portions of the insulating layer from the first holes, the second holes and the pipe hole through the etching process. The insulating layer capable of blocking charges is formed to cover the sidewalls of the conductive patterns 133 in the ring-shaped spaces. Although the first blocking insulating layers 137 remain to cover the sidewalls of the respective conductive patterns 133, the first blocking insulating layers 137 in the ring-shaped spaces may be recessed so that portions of the ring-shaped spaces are respectively open.

The data storage layers 139 may be formed by depositing a memory layer capable of trapping charges and then removing portions of the memory layer from the first holes, the second holes and the pipe hole through an etching process. The memory layer is formed to cover the first blocking insulating layers 137 in the ring-shaped spaces. The data storage layers 139 are portions of the memory layer that fill the ring-shaped spaces and are divided from each other by the interlayer insulating layers 111. That is, each of the data storage layers 139 is disposed only in the corresponding ring-shaped space.

The first blocking insulating layers 137 and the data storage layers 139 that are disposed in the end of each of the line stacks remain as dummy structures that are enclosed by the conductive patterns 133.

In an embodiment, the second blocking insulating layers 135 may be further formed before the first blocking insulating layers 137 are formed. The second blocking insulating layers 135 extend along the surfaces of the interlayer spaces, first holes, second holes and pipe hole.

After the data storage layers 139 have been formed, the cell pillars CP in the first holes and the dummy pillars DP in the second holes may be simultaneously formed.

The process of forming the cell pillars CP and the dummy pillars DP may include the step of forming the tunnel insulating layers 141 along sidewalls of the first holes and the second holes, and the step of forming the channel layers 143 on the tunnel insulating layers 141.

The tunnel insulating layers 141 extend along the sidewalls of the first holes and the second holes such that the first blocking insulating layers 137 and the data storage layers 139 are sealed in the ring-shaped spaces defined between the tunnel insulating layers 141 and the conductive patterns 133.

The tunnel insulating layers 141 are formed after the pipe hole has opened. Therefore, the tunnel insulating layers 141 in the first holes may extend not only along the sidewalls of the first holes, but also along the surface of the pipe hole in the first pipe gate 101. The channel layers 143 are also formed after the pipe hole has opened. Therefore, the channel layers 143 in the first holes may extend not only along the sidewalls of the first holes, but also along the surface of the pipe hole in the first pipe gate 101. The channel layers 143 formed along the sidewalls of the first holes and the surface of the pipe hole may be divided into the drain side channel region D_CH, the source side channel region S_CH and the pipe channel region P_CH. The tunnel insulating layers 141 and the channel layers 143 in the first holes form the cell pillars CP.

The tunnel insulating layers 141 and the channel layers 143 in the second holes may extend not only along sidewalls of the second holes, but also along the bottoms of the second holes. The tunnel insulating layers 141 and the channel layers 143 in the second holes form the dummy pillars DP. The dummy pillars DP, the data storage layers 139 and the first blocking insulating layers 137 that enclose the dummy pillars DP remain as dummy structures. According to the above-described embodiment of the present disclosure, the dummy structure is enclosed by the conductive patterns 133 in the second region in which the respective ends of the line stacks are disposed.

When the channel layers 143 are formed in the form of liners along the surface of the first holes, the second holes and the pipe hole, the interiors of the first holes, second holes and pipe hole may be filled with the core insulating layers 145. The height of the core insulating layers 145 may be lower than that of the channel layers 143. In this case, the capping layers 147 that contact the inner sidewalls of the channel layers 143 may be further formed on the core insulating layers 145. The capping layers 147 and the channel layers 143 may be formed of semiconductor layers. The capping layers 147 may be doped with an impurity. The capping layers 147 in the second holes may remain as dummy structures.

Figure 8E:
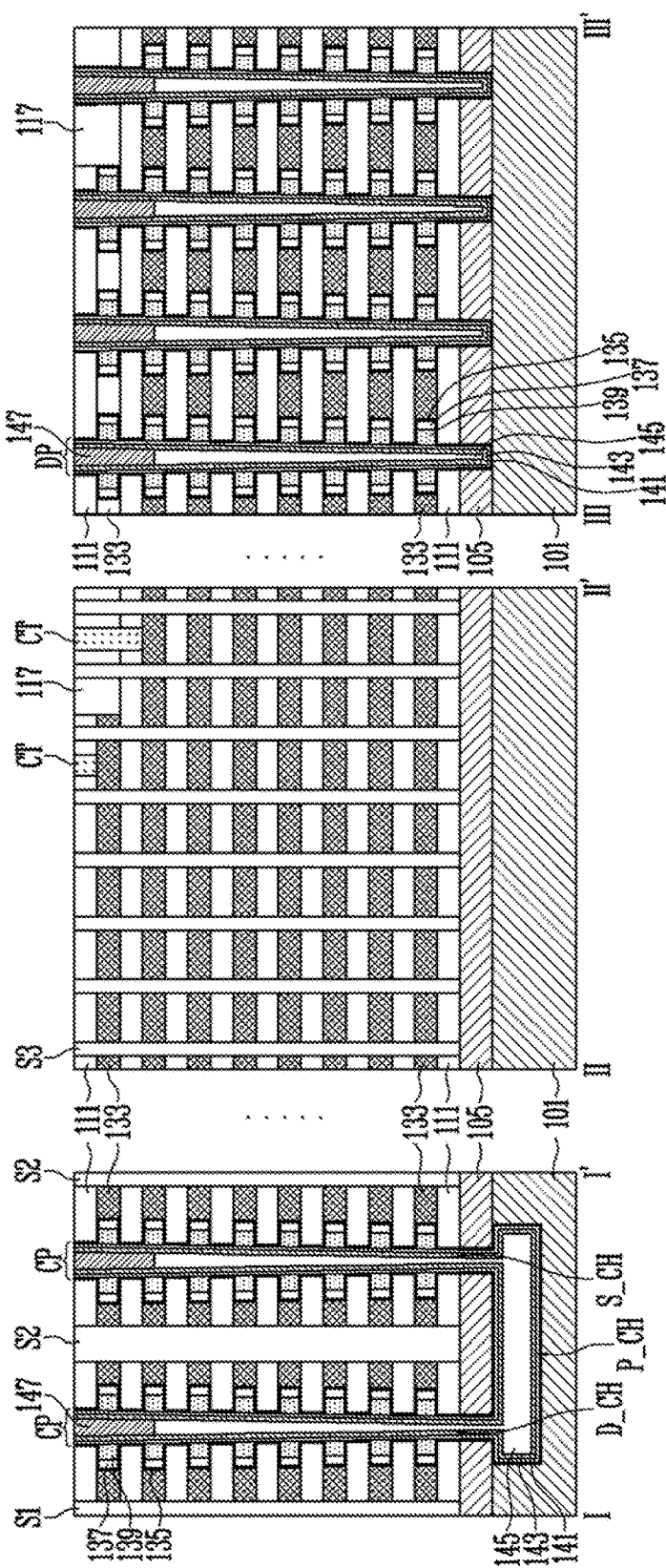

Referring to FIG. 8E, the contact plugs CT passing through at least one of the interlayer insulating layers 111 and the planarization layer 117 are formed in the second region. The contact plugs CT extend to contact the conductive patterns 133. As shown in FIG. 5, the contact plugs CT are disposed between the dummy structures including the dummy pillars DP.

Figure 9A:
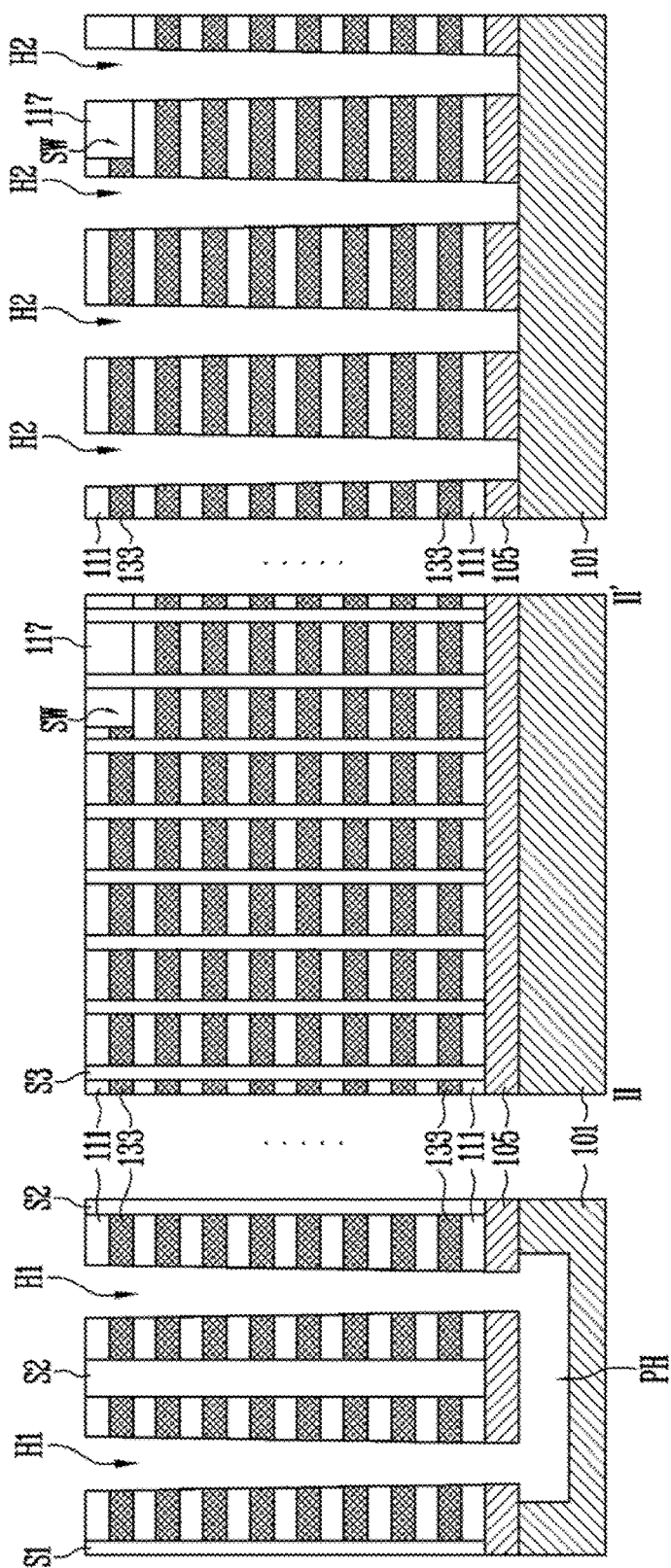

FIGS. 9A and 9B are sectional views illustrating a method for manufacturing a semiconductor device in accordance with an embodiment of the present disclosure. In particular, FIGS. 9A to 9B show, by steps of a process, a sectional view of the first region taken along line I-I' of FIGS. 3A to 3C and sectional views of the second region taken along line II-II' and line III-III' of FIG. 5. In addition, FIGS. 9A to 9B are sectional views illustrating the method for manufacturing a semiconductor device including a pipe transistor.

First, the lower structure and the line stacks, each of which has ends with a stepwise structure SW, are formed through the processes described with reference to FIGS. 8A and 8B. The lower structure may include a pipe gate in which the pipe hole PH is formed, and the pipe gate may include a first pipe gate 101 and a second pipe gate 105. The stepwise structure SW may be covered with a planarization insulating layer 117. A stack defined by the block separation layers S1 is separated into line stacks by the line separation layers S2. Ends of the line stacks disposed in the second region are penetrated by the insulating pillars S3. The interlayer insulating layers 111 are spaced apart from each other with interlayer spaces interposed therebetween.

As described with reference to FIG. 8B, the interlayer spaces may be formed by removing the second material layers through the first holes H1 and the second holes H2, and the pipe hole PH may open through the first holes H1.

Subsequently, as described with reference to FIG. 8C, the conductive patterns 133 are formed through the first holes H1 and the second holes H2. Each of the conductive patterns 133 may completely fill the corresponding interlayer space such that the ring-shaped spaces RS described with reference to FIG. 8C are not open.

Referring to FIG. 9B, the cell pillars CP with which the first holes are filled and the dummy pillars DP with which the second holes are filled may be simultaneously formed.

The cell pillars CP and the dummy pillars DP may be formed through the processes described with reference to FIG. 8D. Unlike the case of FIG. 8D, the first blocking insulating layers 137 are formed on sidewalls of the first holes and the second holes to cover the conductive patterns 133. Thereafter, the data storage layers 139, the tunnel insulating layers 141 and the channel layers 143 are formed.

The first blocking insulating layers 137, the data storage layers 139 and the tunnel insulating layers 141 are formed after the pipe hole has opened. Consequently, the first blocking insulating layer 137, the data storage layer 139 and the tunnel insulating layer 141 in the first holes may extend not only along the sidewalls of the first holes, but also along the surface of the pipe hole in the first pipe gate 101.

The channel layers 143 may be divided into the drain side channel region D_CH, the source side channel region S_CH and the pipe channel region P_CH in the same manner as that described with reference to FIG. 8D.

The core insulating layers 145 and the capping layers 147 may be further formed in the same manner as that described with reference to FIG. 8D.

The second blocking insulating layers 135 may be further formed before the first blocking insulating layers 137 are formed. Some of the second blocking insulating layers 135 extend along the surface of the first holes and the pipe hole, and the other second blocking insulating layers 135 extend along the surface of the second holes.

After the cell pillars CP and the dummy pillars DP have been formed, the contact plugs CT are formed in the second region in the same manner as that described with reference to FIG. 8E.

Figure 10:
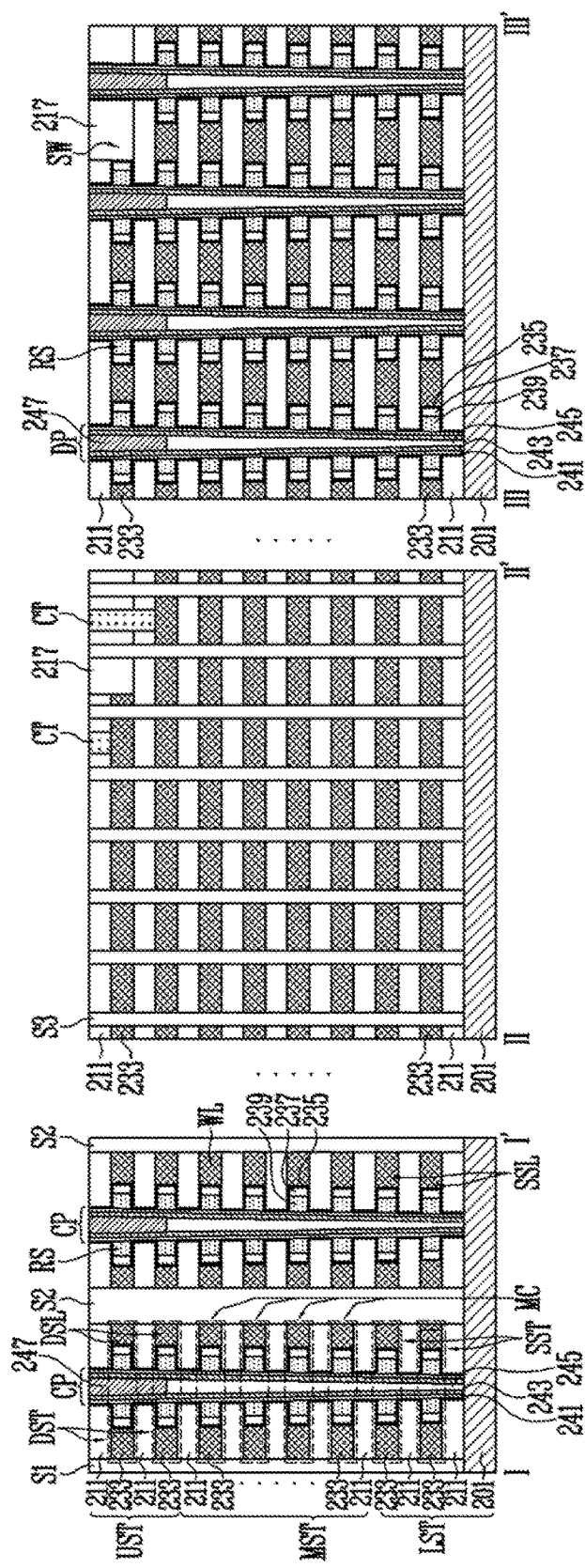
FIG. 10 is a sectional view illustrating a semiconductor device and a manufacturing method thereof according to an embodiment of the present disclosure.
Figure 11:
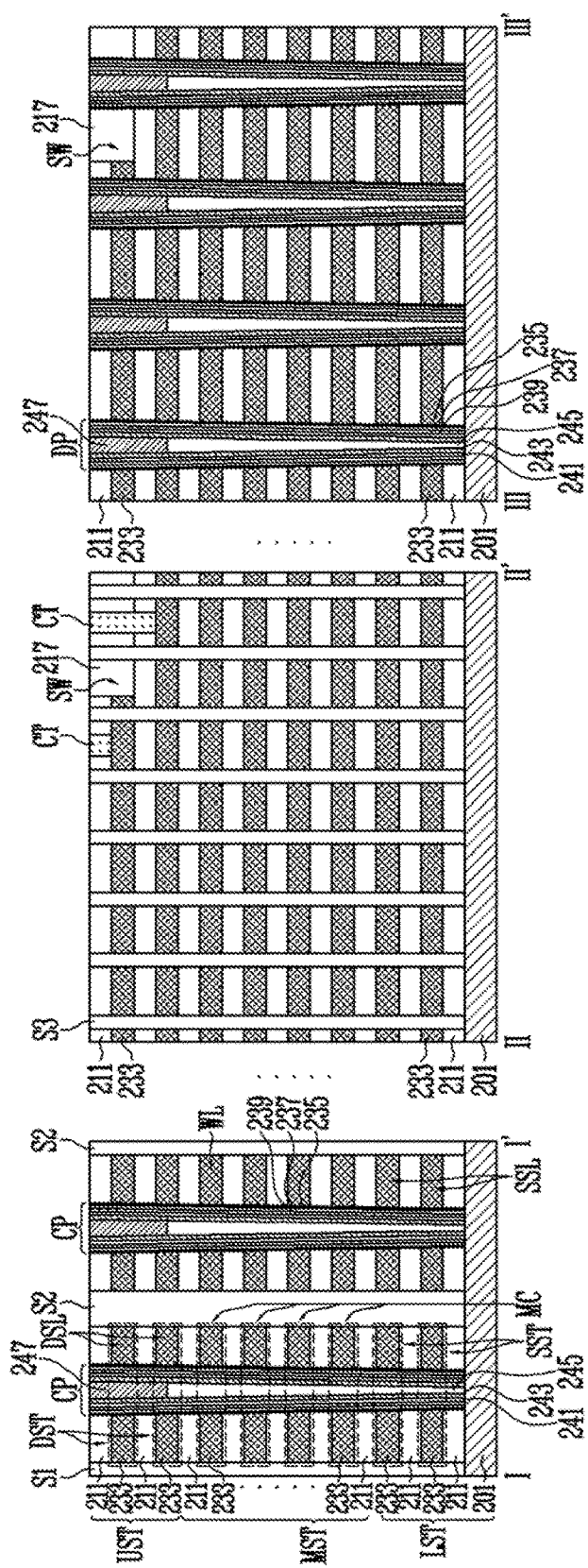
FIG. 11 is a sectional view illustrating a semiconductor device and a manufacturing method thereof according to an embodiment of the present disclosure.

FIG. 10 is a sectional view illustrating a semiconductor device and a manufacturing method thereof according to an embodiment of the present disclosure. FIG. 11 is a sectional view illustrating a semiconductor device and a manufacturing method thereof according to an embodiment of the present disclosure. In particular, each of FIGS. 10 and 11 shows a sectional view of the first region taken along line I-I' of FIGS. 3A to 3C and sectional views of the second region taken along line II-II' and line III-III' of FIG. 5. In addition, FIGS. 10 and 11 are sectional views illustrating the semiconductor device having a structure in which the lower end of a channel layer makes contact with a source region, and the manufacturing method thereof.

Referring to the sectional views taken along line I-I' as illustrated in FIGS. 10 and 11, the cell string may include at least one drain select transistor DST, memory cells MC, and at least one source select transistor SST that are coupled in series by a channel layer 243. The memory cells MC may be disposed between the drain select transistor DST and the source select transistor SST. The channel layer 243 comes into contact with a source region 201 disposed below the source select transistor SST.

The source region 201 may be a conductive layer. For example, the source region 201 may be a doped silicon layer. The source region 201 is included in the lower structure LST described with reference to FIG. 2B.

Interlayer insulating layers 211 and conductive patterns 233 are alternately stacked on the source region 201. The interlayer insulating layers 211 and the conductive patterns 233 that are alternately stacked may be divided into the lower structure LST, the middle structure MST disposed on the lower structure LST, and the upper structure UST disposed on the middle structure MST. The interlayer insulating layers 211 and conductive patterns 233 that are alternately stacked may be penetrated by the block separation layer S1 and the line separation layers S2.

Each of the conductive patterns 233 of the lower structure LST is a source select line SSL that is used as a gate of the corresponding source select transistor SST. The conductive patterns 233 of the middle structure MST are word lines WL that are used as gates of the memory cells MC. Each of the conductive patterns 233 of the upper structure UST is a drain select line DSL that is used as a gate of the corresponding drain select transistor DST. The source select line SSL may be disposed to have a single layered or a two or more layered structure below the word lines WL. The drain select line DSL may be disposed to have a single layered or a two or more layered structure over the word lines WL.

The channel layers 243 disposed in the first region are used as channel regions of the cell strings. The block separation layers S1 define the interlayer insulating layers 211 and the conductive patterns 233 as a block stack. The line separation layers S2 pass through the block stack. The line separation layers are disposed between the channel layers 243.

The Interlayer insulating layers 211 and the conductive patterns 233 of the block stack may be penetrated by the cell pillars CP in the first region. Each of the cell pillars CP may include a first multilayer layer.

Referring to the sectional view of the first region taken along line I-I' as illustrated in FIG. 10, the first multilayer layer of each of the cell pillars CP may include a tunnel insulating layer 241 and the channel layer 243 that are formed along a sidewall of each of first holes passing through the interlayer insulating layers 211 and the conductive patterns 233 in the first region. The tunnel insulating layer 241 is formed such that the source region 201 opens for the channel layer 243 to contact the source region 201.

The arrangement of the conductive patterns 233, ring-shaped spaces RS between the interlayer insulating layers 211, first blocking insulating layers 237 and data storage layers 239 may be the same as that described with reference to FIG. 4A.

The interlayer insulating layers 211 may contact the cell pillars CP. Alternatively, a second blocking insulating layer 235 may be disposed between the interlayer insulating layers 211 and the cell pillars CP. The second blocking insulating layer 235 may extend along the interfaces between the interlayer insulating layers 211 and the cell pillars CRP.

Referring to the sectional view of the first region taken along line I-I' as illustrated in FIG. 11, a first multilayer layer may include a first blocking insulating layer 237, a data storage layer 239, a tunnel insulating layer 241 and a channel layer 243 that are formed along a sidewall of each of first holes passing through the interlayer insulating layers 211 and the conductive patterns 233 in the first region. The channel layer 243 and the tunnel insulating layer 241 may have the same structure as that described with reference to FIG. 10.

The first blocking insulating layer 237 encloses an outer surface of the tunnel insulating layer 241, and the data storage layer 239 is disposed between the tunnel insulating layer 241 and the first blocking insulating layer 237. The first blocking insulating layer 237 and the data storage layer 239 are formed such that the source region 201 opens for the channel layer 243 to contact the source region 201.

Referring to the sectional views of the first region taken along line I-I' as illustrated in FIGS. 10 and 11, the channel layer 243 may be made of semiconductor material. The channel layer 243 may have the form of a liner enclosing a core insulating layer 245. In this case, as described with reference to FIGS. 4A and 4B, each of the cell pillars CP may further include the core insulating layer 245 and a capping layer 247.

The materials and functions of conductive patterns 233, the first blocking insulating layer 237, the data storage layer 239, the tunnel insulating layer 241 and the second blocking insulating layer 235 may be the same as those described with reference to FIGS. 4A and 4B.

Referring to the sectional views of the second region taken along line II-II' and line III-III' as illustrated in FIGS. 10 and 11, the source region 201 extends from the first region to the second region. Also, the line stacks, each of which includes the interlayer insulating layers 211 and the conductive patterns 233 that are alternately stacked, extend from the first region to the second region. Each of the ends of the conductive patterns 233 may have a stepwise structure SW in the second region. The stepwise structure SW may be covered with a planarization insulating layer 217.

Referring to the sectional views of the second region taken along line II-II' as Illustrated in FIGS. 10 and 11, the interlayer Insulating layers 211 and the conductive patterns 233 may be penetrated by the insulating pillars S3 in the second region. As described with reference to FIG. 5, the insulating pillars S3 are disposed at positions spaced apart from each other such that the pad PAD corresponding to an end of each of the line stacks is not separated into a plurality of patterns by the insulating pillars S3.

The contact plugs CT may extend to contact the corresponding conductive patterns 233.

Referring to the sectional views of the second region taken along line III-III' as illustrated in FIGS. 10 and 11, a dummy structure is formed in the second region. The dummy structure may include dummy pillars DP passing through the interlayer insulating layers 211 and the conductive patterns 233 in the second region. Each of the dummy pillars DP may include a second multilayer layer which is made of the same materials as those of the first multilayer layer.

Referring to the sectional view of the second region taken along line III-III' as illustrated in FIG. 10, the second multilayer layer may include the tunnel insulating layer 241 and the channel layer 243 that are formed along a sidewall of each of the cell pillars CP passing through the interlayer insulating layers 211 and the conductive patterns 233 in the second region.

The ring-shaped spaces RS may extend from the first region to spaces between the interlayer insulating layers 211 of the second region. The arrangement of the ring-shaped spaces RS, the conductive patterns 233, the interlayer insulating layers 211, the first blocking insulating layers 237 and the data storage layers 239 in the second region may be the same as that described with reference to FIG. 5. The second blocking insulating layers 235 may be also formed in the second region in the same manner as that in the first region.

Referring to the sectional view of the second region taken along line III-III' as illustrated in FIG. 11, the second multilayer layer may include a first blocking insulating layer 237, a data storage layer 239, a tunnel insulating layer 241 and a channel layer 243 that are formed along a sidewall of each of second holes passing through the interlayer insulating layers 211 and the conductive patterns 233 in the second region.

The first blocking insulating layer 237 encloses an outer surface of the tunnel insulating layer 241, and the data storage layer 139 is disposed between the tunnel insulating layer 241 and the first blocking insulating layer 237. The second blocking insulating layers 235 may also be formed in the second region in the same manner as that in the first region.

Referring to the sectional views of the second region taken along line II-II' and line III-III' as illustrated in FIGS. 10 and 11, the core insulating layer 245 and the capping layer 247 may also be formed in the second region in the same manner as those in the first region. The capping layer 247 disposed in the second region is included in the dummy structure.

The semiconductor device described with reference to FIG. may be formed through a modification of the method for manufacturing the semiconductor device described with reference to FIGS. 8A to 8E. The semiconductor device described with reference to FIG. 11 may be formed through a modification of the method for manufacturing the semiconductor device described with reference to FIGS. 9A and 9B.

Each of the semiconductor devices described with reference to FIGS. 10 and 11 has no pipe transistor. Therefore, in the method for manufacturing the semiconductor devices described with reference to FIGS. 10 and 11, the process of forming the pipe gate, the process of forming the pipe hole and the process of forming the sacrificial layer with which the pipe hole is filled that are described with reference to FIGS. 8A and 9A may be omitted.

Each of the semiconductor devices described with reference to FIGS. 10 and 11 includes the source region 201. Therefore, to manufacture the semiconductor devices described with reference to FIGS. and 11, the source region 201 may be provided by forming a conductive layer such as a doped silicon layer before the first material layers that is, the interlayer insulating layers 211, and the second material layers described with reference to FIGS. 8A and 9A are alternately stacked.

The channel layer 243 of the semiconductor devices described with reference to FIGS. 10 and 11 contacts the source region 201. Therefore, the first holes and the second holes are formed such that the source region 201 is exposed, at the step for manufacturing the semiconductor devices described with reference to FIGS. 10 and 11. In the case of the embodiment of FIG. 10, the second blocking insulating layers 235 and the tunnel insulating layers 241 that are disposed in the first holes and the second holes are removed from the bottom of the first holes and the second holes to open the source region 201. In the case of the embodiment of FIG. 11, the first blocking insulating layer 237, the second blocking insulating layer 235, the data storage layer 239 and the tunnel insulating layers 241 that are disposed in the first holes and the second holes are removed from the bottom of the first holes and the second holes to open the source region 201.

In the embodiment of the present disclosure, a hole defining the channel region of the semiconductor device is used as a path through which conductive patterns are drawn. Therefore, a separate path through which the conductive patterns are drawn may not be required. Therefore, according to the embodiment of the present disclosure, the process of manufacturing the semiconductor device may be simplified.

Figure 12:
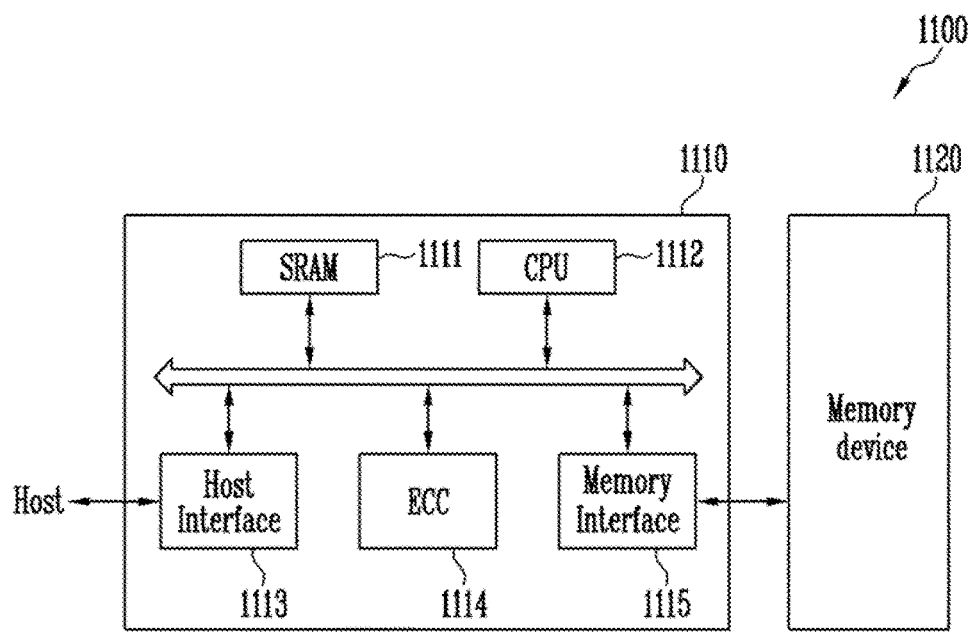
FIG. 12 is a block diagram illustrating a memory system according to an embodiment of the present disclosure.

FIG. 12 is a block diagram illustrating the configuration of a memory system according to an embodiment of the present disclosure.

Referring FIG. 12, the memory system 1100 according to the embodiment includes a memory device 1120 and a memory controller 1110.

The memory device 1120 may include the structure described with reference to FIGS. 4A, 6 and 7A, the structure described with reference to FIGS. 4B, 6 and 7B, the structure described with reference to FIG. 10, or the structure described with reference to FIG. 11. The memory device 1120 may be formed through the processes described with reference to FIGS. 8A to 8E, the processes described with reference to FIGS. 9A and 9B, or the processes described with reference to FIGS. 10 and 11.

The memory device 1120 may be a multi-chip package including a plurality of flash memory chips.

The memory controller 1110 is configured to control the memory device 1120, and may include a Static Random Access Memory (SRAM) 1111, a CPU 1112, a host interface 1113, an Error Correction Code (ECC) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a Read Only Memory (ROM) or the like that stores code data for interfacing with the host.

The above-described memory system 1100 may be a memory card or a Solid State Disk (SSD) equipped with the memory device 1120 and the controller 1110. For example, when the memory system 1100 is an SSD, the memory controller 1110 may communicate with the outside for example, a host via one of various interface protocols, such as an Universal Serial Bus (USB), a MultiMedia Card (MMC), a Peripheral Component Interconnection-Express (PCI-E), a Serial Advanced Technology Attachment (SATA), a Parallel Advanced Technology Attachment (PATA), a Small Computer Small Interface (SCSI), an Enhanced Small Disk Interface (ESDI), or an integrated Drive Electronics (IDE).

Figure 13:
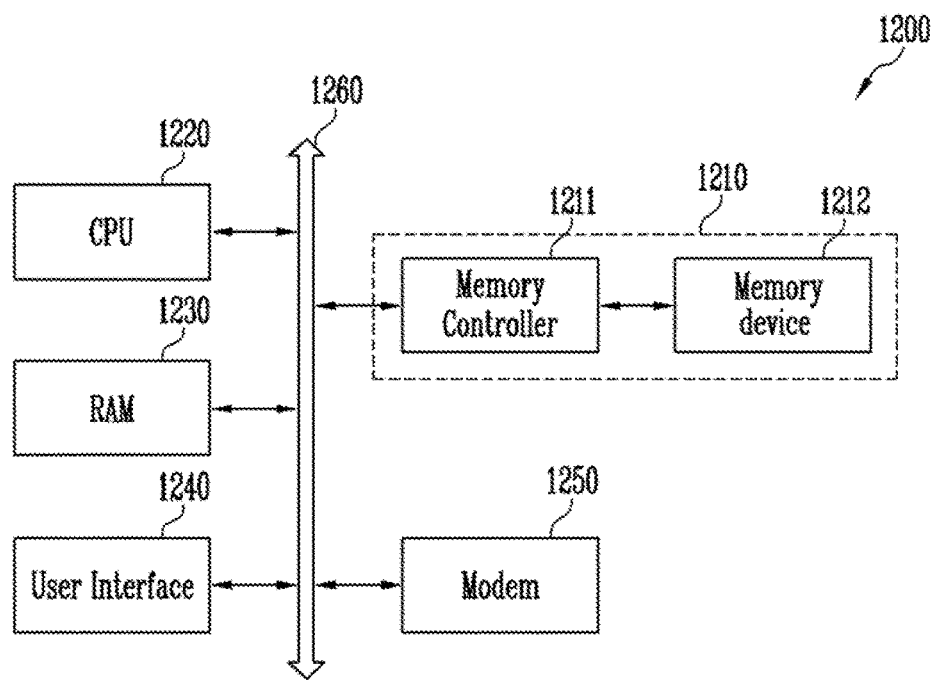
FIG. 13 is a block diagram showing a computing system including the memory system illustrated with reference to FIG. 12.

FIG. 13 is a block diagram illustrating the configuration of a computing system in accordance with an embodiment of the present disclosure.

Referring to FIG. 13, the computing system 1200 in accordance with the embodiment of the present disclosure may include a CPU 1220, a Random Access Memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 12, the memory system 1210 may be configured with the memory device 1212 and the memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, comprising:
   alternately stacking first material layers and second material layers on a lower structure;
   forming first holes passing through the first material layers and the second material layers, each of the first holes defining a channel region;
   removing the second material layers through the first holes such that interlayer spaces between the first material layers are formed;
   forming, through the first holes, conductive patterns which fill respective interlayer spaces; and
   before the forming of the first holes, simultaneously forming a block separation layer dividing the first material layers and the second material layers into block stacks, and line separation layers dividing each of the block stacks into line stacks,
   wherein the forming of the first holes comprises forming second holes passing through ends of the respective line stacks,
   wherein the removing of the second material layers comprises removing the second material layers disposed on the ends of the respective line stacks through the second holes, and
   wherein the forming of the conductive patterns comprises filling the interlayer spaces that are open on the ends of the respective line stacks with the conductive patterns through the second holes.

2. The method according to claim 1, further comprising:
   forming tunnel insulating layers along sidewalls of the first holes and the second holes; and
   forming channel layers on the tunnel insulating layers.

3. The method according to claim 2,
   wherein the lower structure comprises a pipe gate in which a sacrificial layer is embedded, and
   wherein the first holes are formed to expose the sacrificial layer,
   further comprising:
   removing the sacrificial layer before the tunnel insulating layers and the channel layers are formed; and
   opening a pipe hole in the pipe gate such that the tunnel insulating layers and the channel layers are allowed to extend into the pipe gate.

4. The method according to claim 3, wherein the sacrificial layer is made of the same material as material of the second material layers.

5. The method according to claim 3, wherein the sacrificial layer is formed of a non-metal nitride layer.

6. The method according to claim 2,
   wherein the lower structure comprises a source region,
   wherein the first holes are formed to expose the source region, and
   wherein the channel layers are formed to contact the source region.

7. The method according to claim 2, wherein partial regions of the interlayer spaces are filled with the conductive patterns such that a ring-shaped space is defined in each of the interlayer spaces between the tunnel insulating layers and the conductive patterns.

8. The method according to claim 7, wherein the ring-shaped space is defined by recessing the conductive patterns before the tunnel insulating layers are formed.

9. The method according to claim 7, further comprising, before the forming of the tunnel insulating layers:
   forming a blocking insulating layer in the ring-shaped space; and
   forming a data storage layer on the blocking insulating layer.

10. The method according to claim 9, further comprising, before the forming of the data storage layer, recessing the blocking insulating layer such that the blocking insulating layer remains to cover a sidewall of each of the conductive patterns and a portion of the ring-shaped space is open.

11. The method according to claim 10, wherein the data storage layer is disposed in the ring-shaped space.

12. The method according to claim 2,
    wherein the conductive patterns are formed such that the interlayer spaces are completely filled with the conductive patterns,
    further comprising, before the forming of the tunnel insulating layers:
    forming blocking insulating layers on sidewalls of the first holes such that the conductive patterns are covered with the blocking insulating layers; and
    forming data storage layers on the blocking insulating layers.

13. The method according to claim 1, wherein an end of each of the line stacks is patterned in a stepwise shape.

14. The method according to claim 1, wherein the forming of the block separation layer and the line separation layers comprises forming insulating pillars passing through ends of the respective line stacks.

15. The method according to claim 1, further comprising forming dummy structures enclosed by the conductive patterns in the ends of the respective line stacks.

16. The method according to claim 15,
    wherein partial regions of the interlayer spaces in the ends of the respective line stacks are filled with the conductive patterns such that a ring-shaped space is defined in each of the interlayer spaces between the second holes and the conductive patterns, and
    wherein the forming of the dummy structures comprises:
    forming blocking insulating layers to cover sidewalls of the conductive patterns in the ring-shaped spaces;
    forming, on the blocking insulating layers, data storage layers with which the ring-shaped spaces are filled;
    forming tunnel insulating layers on sidewalls of the second holes such that the data storage layers are covered with the tunnel insulating layers; and
    forming channel layers on the tunnel insulating layers.

17. The method according to claim 15,
    wherein the interlayer spaces are completely filled with the conductive patterns in the ends of the respective line stacks, and
    wherein the forming of the dummy structures comprises:
    forming blocking insulating layers on sidewalls of the second holes such that the conductive patterns are covered with the blocking insulating layers;
    forming data storage layers on the blocking insulating layers;
    forming tunnel insulating layers on the data storage layers; and
    forming channel layers on the tunnel insulating layers.

18. The method according to claim 15, further comprising forming, between the dummy structures, contact plugs that contact the conductive patterns.

19. A method for manufacturing a semiconductor device, comprising:
- alternately stacking first material layers and second material layers on a lower structure;
- forming first holes passing through the first material layers and the second material layers, each of the first holes defining a channel region;
- removing the second material layers through the first holes such that interlayer spaces between the first material layers are formed;
- forming, through the first holes, conductive patterns which fill respective interlayer spaces;
- forming tunnel insulating layers along sidewalls of the first holes; and
- forming channel layers on the tunnel insulating layers, each of the channel layers used as the channel region,
- wherein partial regions of the interlayer spaces are filled with the conductive patterns such that a ring-shaped space is defined in each of the interlayer spaces between the tunnel insulating layers and the conductive patterns; and
- wherein the ring-shaped space is defined by recessing the conductive patterns before the tunnel insulating layers are formed.

20. A method for manufacturing a semiconductor device, comprising:
- alternately stacking first material layers and second material layers on a lower structure;
- forming first holes passing through the first material layers and the second material layers, each of the first holes defining a channel region;
- removing the second material layers through the first holes such that interlayer spaces between the first material layers are formed;
- forming, through the first holes, conductive patterns which fill respective interlayer spaces;
- forming tunnel insulating layers along sidewalls of the first holes; and
- forming channel layers on the tunnel insulating layers, each of the channel layers being used as the channel region,
- wherein the conductive patterns are formed such that the interlayer spaces are completely filled with the conductive patterns, and
- wherein before the forming of the tunnel insulating layers:
- forming blocking insulating layers on sidewalls of the first holes such that the conductive patterns are covered with the blocking insulating layers; and
- forming data storage layers on the blocking insulating layers.

* * * * *